United States Patent
Goto

(10) Patent No.: US 7,425,400 B2
(45) Date of Patent: Sep. 16, 2008

(54) PLANOGRAPHIC PRINTING PLATE PRECURSOR

(75) Inventor: Takahiro Goto, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 479 days.

(21) Appl. No.: 10/779,788

(22) Filed: Feb. 18, 2004

(65) Prior Publication Data
US 2004/0170920 A1 Sep. 2, 2004

(30) Foreign Application Priority Data
Feb. 20, 2003 (JP) ............... 2003-043085

(51) Int. Cl.
G03F 7/00 (2006.01)
G00F 7/004 (2006.01)

(52) U.S. Cl. .............. 430/270.1; 430/271.1; 430/273.1; 430/281.1; 430/286.1; 430/302; 430/306; 430/434; 430/435; 430/494; 430/944; 430/945

(58) Field of Classification Search .............. 430/270.1, 430/271.1, 273.1, 281.1, 286.1, 302, 309, 430/434, 435, 494, 944, 945
See application file for complete search history.

(56) References Cited

U.S. PATENT DOCUMENTS

| | | | |
|---|---|---|---|
| 3,725,356 A | 4/1973 | Lüders et al. | |
| 3,804,631 A | 4/1974 | Faust | |
| 3,839,171 A | 10/1974 | Akamatsu et al. | |
| 3,930,865 A | 1/1976 | Faust et al. | |
| 4,019,972 A | 4/1977 | Faust | |
| 4,153,799 A * | 5/1979 | Gilman et al. ........... 548/376.1 |
| 4,239,849 A | 12/1980 | Lipson et al. | |
| 4,476,215 A | 10/1984 | Kausch | |
| 4,499,163 A | 2/1985 | Ishimaru et al. | |
| 4,510,227 A | 4/1985 | Mohr et al. | |
| 4,537,855 A | 8/1985 | Ide | |
| 4,687,727 A | 8/1987 | Toyama et al. | |
| 4,772,538 A | 9/1988 | Walls et al. | |
| 4,950,581 A | 8/1990 | Koike et al. | |
| 4,952,478 A | 8/1990 | Miyagawa et al. | |
| 5,080,999 A | 1/1992 | Imai et al. | |
| 5,200,292 A | 4/1993 | Shinozaki et al. | |

(Continued)

FOREIGN PATENT DOCUMENTS

CA 1338095 2/1996

(Continued)

OTHER PUBLICATIONS

McGinniss, Vincent D., "Radiation Curing: 6. Curing with Ultraviolet, Visible and Infrared Processing Equipment" From Kirk-Othmer Encyclopedia of Chemical Technology, copyright 1996, by John Wiley & Sons, Inc., Article Online posting date Dec. 4, 2000.

(Continued)

Primary Examiner—Amanda C. Walke
(74) Attorney, Agent, or Firm—Sughrue Mion, PLLC

(57) ABSTRACT

A planographic printing plate precursor, including: a substrate; a photosensitive layer containing an IR absorber, a polymerization initiator, a polymerizable compound and a binder polymer; and a protective layer containing a UV absorber, disposed in this order. The photosensitive layer exhibits reduction in solubility in an alkaline developing solution upon being exposed to light having a wavelength of 750 nm to 1400 nm.

17 Claims, 6 Drawing Sheets

U.S. PATENT DOCUMENTS

| | | | |
|---|---|---|---|
| 5,246,816 A | 9/1993 | Yamashita et al. | |
| 5,340,699 A | 8/1994 | Haley et al. | |
| 5,641,608 A | 6/1997 | Grunwald et al. | |
| 5,705,322 A | 1/1998 | West et al. | |
| 5,879,861 A * | 3/1999 | Van Damme et al. | 430/302 |
| 5,919,601 A | 7/1999 | Nguyen et al. | |
| 5,952,154 A | 9/1999 | Barr et al. | |
| 5,965,319 A | 10/1999 | Kobayashi | |
| 5,985,526 A * | 11/1999 | Tutt et al. | 430/332 |
| 6,013,412 A | 1/2000 | Aoshima | |
| 6,030,750 A | 2/2000 | Vermeersch et al. | |
| 6,165,685 A | 12/2000 | Maerz et al. | |
| 6,309,792 B1 | 10/2001 | Hauck et al. | |
| 6,399,689 B1 | 6/2002 | Scarlette | |
| 6,423,462 B1 | 7/2002 | Kunita | |
| 6,482,571 B1 | 11/2002 | Teng | |
| 6,566,035 B1 | 5/2003 | Aoshima | |
| 6,569,603 B2 * | 5/2003 | Furukawa | 430/287.1 |
| 6,576,401 B2 | 6/2003 | Teng | |
| 6,733,948 B2 | 5/2004 | Nakamura et al. | |
| 6,794,116 B2 | 9/2004 | Oshima | |
| 6,838,222 B2 * | 1/2005 | Aoshima et al. | 430/176 |
| 6,861,200 B2 | 3/2005 | Oshima | |
| 6,933,093 B1 * | 8/2005 | Arias et al. | 430/270.1 |
| 2001/0036598 A1 | 11/2001 | Shimada et al. | |
| 2002/0051934 A1 | 5/2002 | Nakamura et al. | |
| 2002/0055058 A1 | 5/2002 | Sorori et al. | |
| 2002/0160295 A1 | 10/2002 | Aoshima et al. | |
| 2002/0177074 A1 | 11/2002 | Hoshi et al. | |
| 2002/0197564 A1 | 12/2002 | Timpe et al. | |
| 2003/0008239 A1 | 1/2003 | Fujimaki et al. | |
| 2003/0068575 A1 | 4/2003 | Yanaka | |
| 2003/0073032 A1 | 4/2003 | Aoshima | |
| 2003/0082478 A1 | 5/2003 | Itakura et al. | |
| 2003/0162127 A1 | 8/2003 | Kikuchi | |
| 2003/0186174 A1 | 10/2003 | Nagase | |
| 2004/0063034 A1 | 4/2004 | Goto | |
| 2004/0072101 A1 | 4/2004 | Sugasaki et al. | |
| 2004/0131971 A1 * | 7/2004 | Sugasaki et al. | 430/281.1 |
| 2004/0137369 A1 | 7/2004 | Shimada | |
| 2004/0157153 A1 * | 8/2004 | Takamuki | 430/270.1 |
| 2004/0170920 A1 | 9/2004 | Goto | |
| 2004/0170922 A1 | 9/2004 | Goto | |
| 2004/0175648 A1 | 9/2004 | Goto | |
| 2004/0202957 A1 | 10/2004 | Murota | |
| 2004/0223042 A1 | 11/2004 | Goto | |
| 2004/0244619 A1 | 12/2004 | Goto | |
| 2005/0026082 A1 | 2/2005 | Shimada | |
| 2005/0037282 A1 | 2/2005 | Sonokawa | |
| 2005/0064332 A1 | 3/2005 | Goto | |
| 2005/0100821 A1 | 5/2005 | Goto | |

FOREIGN PATENT DOCUMENTS

| | | | |
|---|---|---|---|
| EP | 0 377 321 A2 | 7/1990 | |
| EP | 0 684 522 A1 | 11/1995 | |
| EP | 0 779 161 A1 | 6/1997 | |
| EP | 0 919 870 A1 | 6/1999 | |
| EP | 0 950 517 A1 | 10/1999 | |
| EP | 0 950 518 A1 | 10/1999 | |
| EP | 1 033 624 A1 | 9/2000 | |
| EP | 1 096 315 A1 | 5/2001 | |
| EP | 1 110 747 A1 | 6/2001 | |
| EP | 1 160 095 A2 | 12/2001 | |
| EP | 1 176 467 A1 | 1/2002 | |
| EP | 1176467 A1 * | 1/2002 | |
| EP | 1 182 033 A1 | 2/2002 | |
| EP | 1 186 407 A1 | 3/2002 | |
| EP | 1 216 830 A2 | 6/2002 | |
| EP | 1 219 464 A2 | 7/2002 | |
| EP | 1 235 107 A1 * | 8/2002 | |
| EP | 1 241 002 A2 | 9/2002 | |
| EP | 1 245 405 A2 | 10/2002 | |
| EP | 1 249 343 A2 | 10/2002 | |
| EP | 1 249 731 A2 | 10/2002 | |
| EP | 1249343 A2 * | 10/2002 | |
| EP | 1 332 870 A2 | 8/2003 | |
| EP | 1 338 921 A2 | 8/2003 | |
| EP | 1 341 040 A1 | 9/2003 | |
| EP | 1 369 231 A2 | 12/2003 | |
| EP | 1 400 851 A2 | 3/2004 | |
| EP | 1 449 650 A2 | 8/2004 | |
| EP | 1 450 207 A1 | 8/2004 | |
| GB | 1 521 372 | 8/1978 | |
| JP | 59-92723 A | 7/1979 | |
| JP | 54-25957 B2 | 8/1979 | |
| JP | 54-34327 B2 | 10/1979 | |
| JP | 58-29803 A | 2/1983 | |
| JP | 58-12577 B2 | 3/1983 | |
| JP | 58-134629 A | 8/1983 | |
| JP | 59-44615 A | 3/1984 | |
| JP | 59-71048 A | 4/1984 | |
| JP | 2-161442 A | 6/1990 | |
| JP | 4-31863 A | 2/1992 | |
| JP | 4-106548 A | 4/1992 | |
| JP | 7-20629 A | 1/1995 | |
| JP | 7-60268 B2 | 6/1995 | |
| JP | 7-271029 A | 10/1995 | |
| JP | 8-108621 A | 4/1996 | |
| JP | 8-137096 A | 5/1996 | |
| JP | 8-248639 A | 9/1996 | |
| JP | 9-43847 A | 2/1997 | |
| JP | 9-134011 A | 5/1997 | |
| JP | 2712564 B2 | 10/1997 | |
| JP | 10-195119 A | 7/1998 | |
| JP | 11-212252 A | 8/1999 | |
| JP | 11-231535 A | 8/1999 | |
| JP | 11-258801 A | 9/1999 | |
| JP | 2000-131837 A | 5/2000 | |
| JP | 2000-267265 A | 9/2000 | |
| JP | 2001-133969 A | 5/2001 | |
| JP | 2001-290271 A | 10/2001 | |
| JP | 2002-40652 A | 2/2002 | |
| JP | 2002-72462 | 3/2002 | |
| JP | 2002-268217 A | 9/2002 | |
| JP | 2002-278081 A | 9/2002 | |
| JP | 2003-29408 A | 1/2003 | |
| JP | 2003-043687 A | 2/2003 | |
| WO | WO 00/48836 A1 | 8/2000 | |

OTHER PUBLICATIONS

SR-295, product bulletin, Sartomer Company, Exton, PA, one page, dated Nov. 1998 from internet through Sartomer web site.
SR-399, Product bulletin, Sartomer Company, Exton, PA, one page, dated Nov. 1998, from internet through Sartomer web site.
SR-492, product bulletin, Sartomer Company, Exton, PA, one page, dated Nov. 1998, from internet through Sartomer web site.
CD-501, product bulletin, Sartomer Company, Exton, PA, one page, dated Nov. 1999, from internet through Sartomer web site.
SR-368, product bulletin, Sartomer Company, Exton, PA, 1 page, dated Nov. 1998, from internet through Sartomer web site.
Product Data, Scripset 550 Styrene Maleic Anhydride Copolymer Solid, Hercules Incorporated, copyright 1999, dated Jun. 2000 from internet.
European Search Report dated Jul. 2, 2002.
European Search Report dated Apr. 16, 2004.
European Search Report dated Jan. 16, 2004.
European Search Report dated Jun. 14, 2005.
Jerry March: "Advanced organic chemistry: reactions, mechanisms, and structure" 1992, Wiley-Interscience, 4$^{th}$ Ed., USA, XP 002275533 p. 280, Table 9.4.

ben-zyl from The American Heritage dictionary of the English Language, Fourth Edition, copyright 2000 by Houghton Mifflin Company found at yourdictionary.com, one page.
Mineo et al, 08062834, English Abstract of Japanese Published Application 08062834 dated Mar. 8, 1996, p. Patent Abstracts of Japan dated 1996.
Office Action dated Jan. 31, 2005 from U.S. Appl. No. 10/673,332.
Office Action dated Jan. 25, 2005 from U.S. Appl. No. 10/673,332.
Office Action dated Apr. 18, 2005 from U.S. Appl. No. 10/781,922.
Office Action dated Mar. 9, 2005 from U.S. Appl. No. 10/671,776.
Office Action dated Feb. 23, 2005 from U.S. Appl. No. 10/669,696.
Office Action dated Apr. 18, 2005 from U.S. Appl. No. 10/781,645.
Registry No. 2154-56-5, one page, "benzyl".
Patent Abstracts of Japan for Publication No. 0806283, Published Mar. 8, 1994.
Patent Abstracts of Japan for Publication No. 59-053836, Published Mar. 28, 1984, Applicant: Fuji Photo Film Co., Ltd.
Office Action dated Jan. 27, 2006 for U.S. Appl. No. 10/948,470.

* cited by examiner

F I G. 3
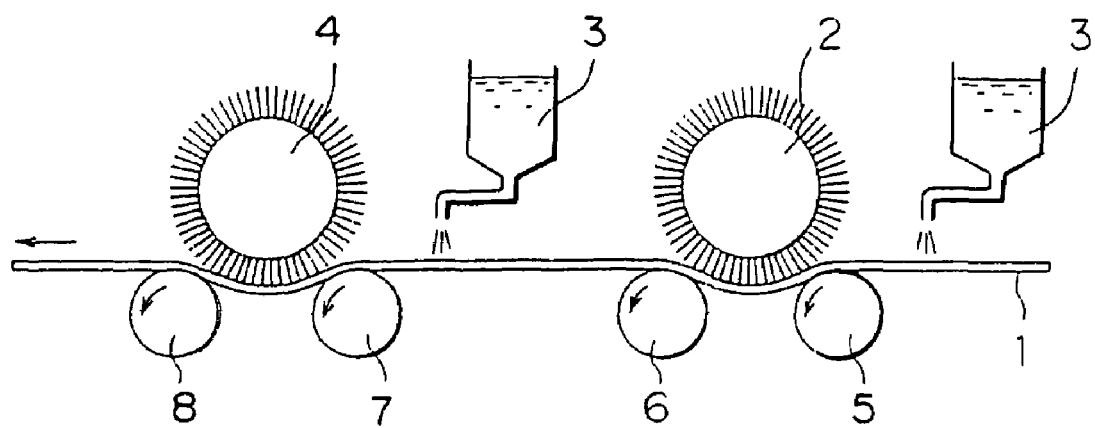

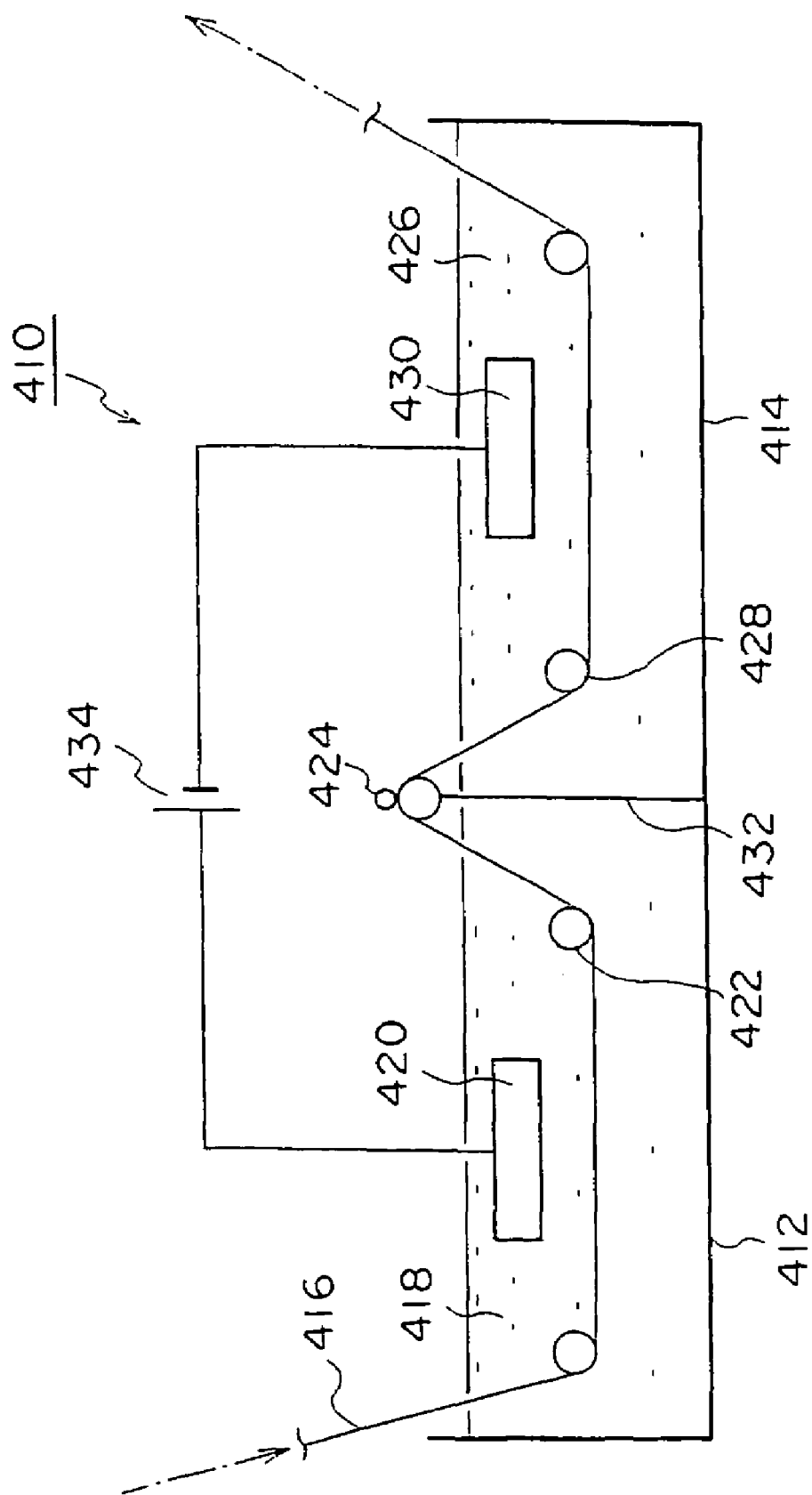

PLANOGRAPHIC PRINTING PLATE PRECURSOR

CROSS-REFERENCE TO RELATED APPLICATION

This application claims priority under 35USC 119 from Japanese Patent Application No. 2003-43085, the disclosure of which is incorporated by reference herein.

BACKGROUND OF THE INVENTION

1. Field of the Invention

The present invention relates to a negative type planographic printing plate precursor and in particular to a negative type planographic printing plate precursor capable of highly sensitive writing with an infrared laser and excellent in handlability under white light.

2. Description of the Related Art

Conventionally, a PS plate having a lipophilic photosensitive resin layer provided on a hydrophilic substrate has been widely used as a planographic printing plate precursor, and a desired printing plate is obtained by a plate-making method which usually involves masked exposure (surface exposure) via a lithographic film and then removing non-image regions by dissolution. In recent years, digitalization techniques which involve electronic treatment, accumulation and output of image information with a computer are spreading. A wide variety of new image output systems compatible with the digitalization techniques came to be practically used. As a result, there has been demand for computer-to-plate (CTP) techniques of producing a printing plate directly by scanning a highly directional light such as a laser light according to digitalized image information without a lithographic film. It has been a critical technical issue to provide a planographic printing plate precursor suitable for these techniques.

As the planographic printing plate precursor capable of such scanning exposure to light, a planographic printing plate precursor comprising a hydrophilic substrate provided thereon with a lipophilic photosensitive resin layer (also referred to as the photosensitive layer) containing a photosensitive compound capable of generating active species such as radicals or Bronsted acid upon being exposed to laser light has been available. This planographic printing plate precursor is subjected to laser scanning according to digital information to generate active species acting on the photosensitive layer to cause physical or chemical change, thus making the layer insoluble, and then subjected to development to give a negative type planographic printing plate. In particular, a planographic printing plate precursor wherein a photopolymerizable photosensitive layer containing a photopolymerization initiator excellent in speed, an ethylenically unsaturated compound capable of addition polymerization, and a binder polymer soluble in an alkaline developing solution, and if necessary an oxygen-impermeable protective layer, are disposed on a hydrophilic substrate is superior in productivity, can be easily developed, and is excellent in resolution and inking property. Thus, it can be a planographic printing plate having desired printing performance.

Examples of the binder polymer included in the photosensitive layer used to date include organic polymers capable of alkali development, such as methacrylic acid copolymers, acrylic acid copolymers, itaconic acid copolymers, crotonic acid copolymers, maleic acid copolymers, and partially esterified maleic acid copolymers (see, for example, Japanese Patent Application Laid-Open (JP-A) No. 59-44615, Japanese Patent Application Publication (JP-B) Nos. 54-34327, 58-12577, 54-25957, JP-A Nos. 54-92723, 59-53836, 59-71048 and 2002-40652). In conventional planographic printing plate precursors having a photosensitive layer containing such binder polymers, however, an image region, which is supposed to be cured, is not sufficiently cured and a developing solution permeates to the image region in the development step. As a result, the photosensitive layer is damaged, leading to deterioration in printing press life. To solve this problem, it has been common to carry out heat treatment after exposure preceding development of the image so as to promote curing.

The conventional planographic printing plate precursor comprising the UV-curing photosensitive layer undergoes undesired decomposition of an initiator with UV rays emitted from a fluorescent lamp etc. during storage, to cause a problem of staining in a non-image region. As a result, it has been unsuitable to store and handle the planographic printing plate precursor under white light. To solve this problem, for example JP-B No. 7-60268 and JP-A No. 8-137096 teach techniques in which coloring agents having a major absorption spectrum in the vicinity of safety light emission spectrum or compounds having an absorption spectrum peak in a range of 400 to 700 nm are contained in the protective layer. JP-A No. 8-248639 for example discloses an image-forming material provided with a protective layer whose reflection absorbance is set in a specific wavelength range. On the other hand, a planographic printing plate precursor for forming an image by being exposed to infrared laser light can provide a product excellent in handlability under white light (hereinafter referred to as safelight property) by selecting a UV-stable compound as a component in the photosensitive layer. However, some coloring agents commonly added, for the purpose of improving visibility of an image, to such image-forming materials to be exposed by an infrared laser have sub-absorption in the UV range. In such cases, the coloring agents absorb UV rays and thereby generate excited electrons. Thus, even in the image-forming materials to be exposed by infrared light, a polymerization initiator may initiate undesired polymerization due to excited electrons generated from the coloring agents when handled under white light. This may result a problem of staining in a non-image region, and therefore the stability of such image-forming materials under white light is very important in terms of practicality.

Therefore, there is demand for a planographic printing plate precursor which is excellent in safelight properties, can be handled under white light, and is excellent in printing press life even in a halftone dot region.

SUMMARY OF THE INVENTION

The object of the present invention is to provide a planographic printing plate precursor which enables writing with high sensitivity by an infrared laser, which is excellent in safelight, which can be handled under white light, and which is excellent in printing press life even in a halftone dot region.

Extensive study is made to achieve the object described above. As a result, it is found that the object can be achieved by providing a photosensitive layer to be cured by polymerization with light or heat and then arranging a UV absorber-containing protective layer thereon, and the invention was thereby completed.

A first aspect of the present invention is to provide a planographic printing plate precursor comprising a substrate; a photosensitive layer comprising an IR absorber, a polymerization initiator, a polymerizable compound and a binder polymer; and a protective layer containing a UV absorber, the substrate and the layers being disposed in this order. The photosensitive layer exhibits reduction in solubility in an alkaline developing solution upon being exposed to light having a wavelength of 750 nm to 1400 nm.

The UV absorber contained in the protective layer may have a maximum absorption at a wavelength of 300 to 420 nm.

The photosensitive layer in the invention may further comprise a compound having a molecular weight of 3000 or less, containing at least one carboxylic group. The binder polymer contained in this photosensitive layer may be a binder polymer having the repeating unit represented by the following formula (I):

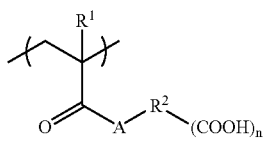

Formula (I)

In formula (I), $R^1$ represents a hydrogen atom or a methyl group; $R^2$ represents a linking group composed of atoms selected from carbon atoms, hydrogen atoms, oxygen atoms, nitrogen atoms, sulfur atoms and halogen atoms, wherein the number of atoms excluding atoms in a substituent group is 2 to 30; A represents an oxygen atom or —$NR^3$— wherein $R^3$ represents a hydrogen atom or a $C_{1-10}$ monovalent hydrocarbon group; and n is an integer from 1 to 5.

The phrase "disposed in this order" means that the photosensitive layer and the protective layer are disposed on the substrate in this order. However, one or plurality of other optional layers such as an intermediate layer, a back coat layer, and the like may be present if needed.

The working mechanism in the invention is not evident but can be estimated as follows:

The deterioration of safelight safety is considered to be caused by UV absorption of a dye. It is found that safelight safety suitability can be provided with a planographic printing plate precursor by imparting UV filter effect to an upper layer on the photosensitive layer. That is, it is considered that in the invention, problems caused by sub-absorption of the dye in the photosensitive layer can be effectively prevented by adding an UV absorber to the protective layer. Filter effect can be improved by adjusting the type and the content of the UV absorber added to the protective layer, whereby a planographic printing plate of the invention can be handled even under white light. Even if the UV absorber is added to the protective layer, there is no worry about unnecessary polymerization due to the presence of the UV absorber. The components of the protective layer are water-soluble, and thus are not incorporated in the adjacent photosensitive layer.

BRIEF DESCRIPTION OF THE DRAWINGS

FIG. 3 is a side view showing the concept of a brush graining step used for a mechanical surface roughening treatment in preparation of a substrate of a planographic printing plate of the present invention.

FIG. 6 is a schematic view of an anodizing device used for an anodizing treatment in the preparation of a substrate of a planographic printing plate of the invention.

DETAILED DESCRIPTION OF THE INVENTION

Figure 1:
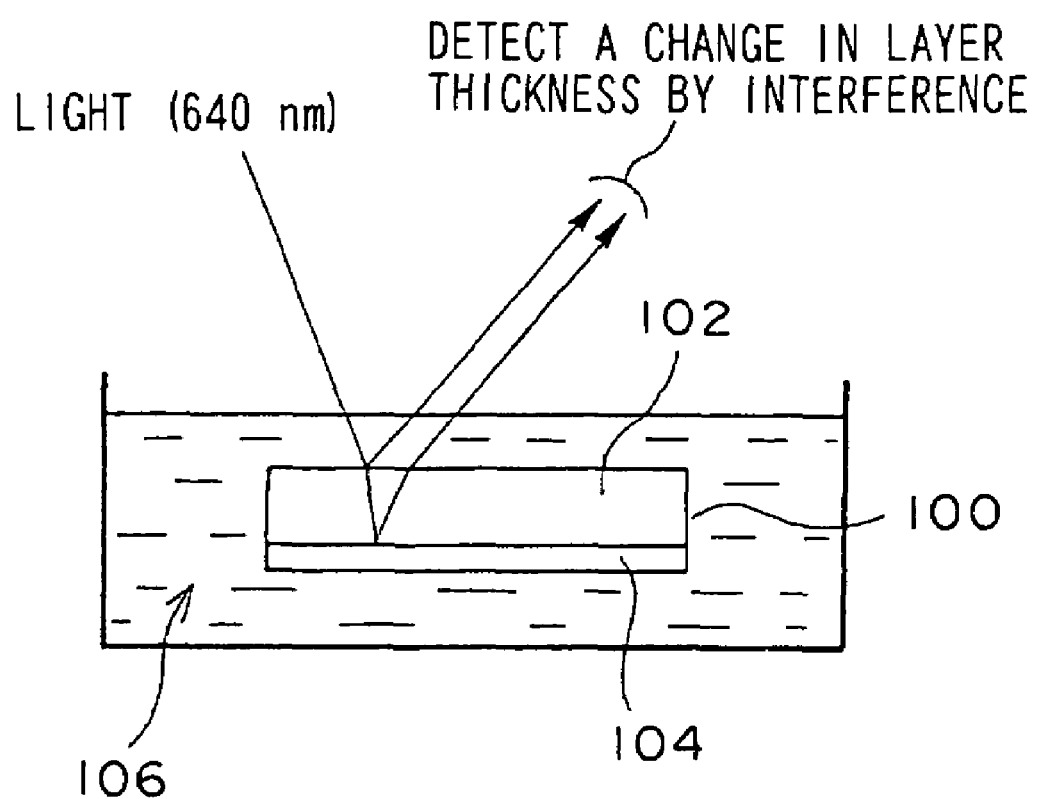
FIG. 1 is a schematic diagram of one example of a DRM interference measuring device for measuring the dissolving behavior of a photosensitive layer.

Hereinafter, the planographic printing plate precursor of the present invention is described in more detail.

The planographic printing plate precursor of the invention comprises a substrate; a photosensitive layer comprising an IR absorber, a polymerization initiator, a polymerizable compound and a binder polymer; and an overcoat layer containing a UV absorber, being disposed in this order. The photosensitive layer exhibits reduction in solubility in an alkaline developing solution upon being exposed to light having a wavelength of 750 nm to 1400 nm.

The developing rate of an unexposed portion of the photosensitive layer in an alkaline developing solution having a pH of 10 to 13.5 to is preferably 80 nm/sec or more. The permeation rate of the alkaline developing solution to an exposed portion of the photosensitive layer is preferably 100 nF/sec or less.

The developing rate by an alkaline developing solution having a pH of 10 to 13.5 refers to a value obtained by dividing a thickness (nm) of the photosensitive layer by time (sec) required for the developing process. The permeation rate of the alkaline developing solution refers to a value that indicates the rate of change in the electrostatic capacity (F) of an exposed portion of the photosensitive layer formed on a conductive substrate upon being dipped in a developing solution.

[Photosensitive Layer]

The photosensitive layer in the planographic printing plate precursor of the invention is a polymerizable negative type photosensitive layer comprising an IR absorber, a polymerization initiator, a polymerizable compound (also referred to as addition-polymerizable compound) and a binder polymer as essential components. The binder polymer is preferably a specific binder polymer described later. The polymerizable negative type photosensitive layer has a mechanism wherein the polymerization initiator is decomposed with heat to generate radicals causing polymerization reaction of the polymerizable compound. This photosensitive layer is particularly preferred in plate-making of direct drawing with laser light having a wavelength of 750 to 1,400 nm, to exhibit higher printing press life and image-forming property than those of conventional planographic printing plate precursors.

Hereinafter, preferred components of the photosensitive layer in the planographic printing plate precursor of the invention are described respectively.

(Polymerizable Compound)

The addition-polymerizable compound used in the heat-polymerizable negative type photosensitive layer and having at least one ethylenically unsaturated double bond is selected from compounds each having at least one (preferably two or more) ethylenically unsaturated bond. A group of such compounds is widely used in this industrial field, and in the invention, these compounds can be used without any particular limitation. These compounds occur in chemical forms such as monomers, prepolymers, that is, dimers, trimers and oligomers, as well as mixtures and copolymers thereof. Examples of such monomers and copolymers include unsaturated carboxylic acids (e.g., acrylic acid, methacrylic acid, itaconic acid, crotonic acid, isocrotonic acid, maleic acid etc.) and esters and amides thereof, and preferably used among these compounds are esters between unsaturated carboxylic acids and aliphatic polyvalent alcohols and amides between unsaturated carboxylic acids and aliphatic polyvalent amines. Also preferably used among these compounds are unsaturated carboxylates having nucleophilic substituent groups such as hydroxyl group, amino group, mercapto group etc., addition-reaction products of amides with monofunctional or multifunctional isocyanates or epoxy compounds, and dehydration condensation reaction products of amides with monofunctional or multifunctional carboxylic acids. Also preferably used among these compounds are unsaturated carboxylates having electrophilic substituent groups such as isocyanate group, epoxy group etc., addition-reaction products of amides with monofunctional or multifunctional alcohols, amines or thiols, unsaturated carboxylates having eliminating substituent groups such as halogen group, tosyloxy group etc., and substitution-reaction products of amides with monofunctional or multifunctional alcohols, amines or thiols. Use can also be made of a group of those compounds wherein the above-described carboxylic acids have been replaced by unsaturated phosphonic acids, styrene, vinyl ethers etc.

As the ester monomers between aliphatic polyvalent alcohols and unsaturated carboxylic acids, the acrylates include ethylene glycol diacrylate, triethylene glycol diacrylate, 1,3-butane diol diacrylate, tetramethylene glycol diacrylate, propylene glycol diacrylate, neopentyl glycol diacrylate, trimethylol propane triacrylate, trimethylol propane tri(acryloyloxypropyl)ether, trimethylol ethane triacrylate, hexane diol diacrylate, 1,4-cyclohexane diol diacrylate, tetraethylene glycol diacrylate, pentaerythritol diacrylate, pentaerythritol triacrylate, pentaerythritol tetracrylate, dipentaerythritol diacrylate, dipentaerythritol hexacrylate, sorbitol triacrylate, sorbitol tetracrylate, sorbitol pentacrylate, sorbitol hexacrylate, tri(acryloyloxyethyl) isocyanurate, polyester acrylate oligomers etc.

The methacrylates include tetramethylene glycol dimethacrylate, triethylene glycol dimethacrylate, neopentyl glycol dimethacrylate, trimethylol propane trimethacrylate, trimethylol ethane trimethacrylate, ethylene glycol dimethacrylate, 1,3-butane diol dimethacrylate, hexane diol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethyl methane, bis[p-(methacryloxyethoxy)phenyl]dimethyl methane etc.

The itaconates include ethylene glycol diitaconate, propylene glycol diitaconate, 1,3-butane diol diitaconate, 1,4-butane diol diitaconate, tetramethylene glycol diitaconate, pentaerythritol diitaconate, sorbitol tetraitaconate etc. The crotonates include ethylene glycol dicrotonate, tetramethylene glycol dicrotonate, pentaerythritol dicrotonate, sorbitol tetradicrotonate etc. The isocrotonates include ethylene glycol diisocrotonate, pentaerythritol diisocrotonate, sorbitol tetraisocrotonate etc. The maleates include ethylene glycol dimaleate, triethylene glycol dimaleate, pentaerythritol dimaleate, sorbitol tetramaleate etc.

Other preferably used esters include, for example, aliphatic alcohol-based esters described in JP-B Nos. 46-27926, 51-47334 and JP-A No. 57-196231, those having an aromatic skeleton described in JP-A Nos. 59-5240, 59-5241 and 2-226149, and those having an amino group described in JP-A No. 1-165613. The ester monomers can also be used as a mixture.

As the monomers, the amides between aliphatic polyvalent amines and unsaturated carboxylic acids include e.g. methylene bis-acrylamide, methylene bis-methacrylamide, 1,6-hexamethylene bis-acrylamide, 1,6-hexamethylene bis-methacrylamide, diethylene triamine trisacrylamide, xylylene bis-acrylamide, xylylene bis-methacrylamide etc. Preferred examples of other amide type monomers include those having a cyclohexylene structure described in JP-B No. 54-21726.

Urethane type addition-polymerizable compounds produced by addition reaction between isocyanates and hydroxyl groups are also preferred, and examples thereof include vinyl urethane compounds containing two or more polymerizable vinyl groups in one molecule, which are prepared by adding vinyl monomers containing a hydroxyl group shown in formula (II) below to polyisocyanates having two or more isocyanate groups in one molecule as described in JP-B No. 48-41708.

$$CH_2=C(R_4)COOCH_2CH(R_5)OH \qquad \text{Formula (II)}$$

In formula (II), $R_4$ and $R_5$ each independently represent H or $CH_3$.

Urethane acrylates described in JP-A No. 51-37193, JP-B Nos. 2-32293 and 2-16765 and urethane compounds having an ethylene oxide-type skeleton described in JP-B Nos. 58-49860, 56-17654, 62-39417 and 62-39418 are also preferred. Addition-polymerizable compounds having an amino structure or sulfide structure in the molecule as described in JP-A Nos. 63-277653, 63-260909 and 1-105238 can be used to prepare photopolymerizable compositions extremely excellent in photosensitizing speed.

As other examples, multifunctional acrylates and methacrylates such as polyester acrylates and epoxy acrylates obtained by reacting epoxy resin with (meth)acrylic acid as described in JP-A No.48-64183, JP-B Nos. 49-43191 and 52-30490 can be mentioned. Specific unsaturated compounds described in JP-B Nos. 46-43946, 1-40337 and 1-40336 and vinyl phosphonic acid-type compounds described in JP-A No. 2-25493 can also be mentioned. In some cases, a structure containing a perfluoroalkyl group described in JP-A No. 61-22048 is preferably used. Photosetting monomers and oligomers described in the Journal of Japanese Adhesive Society, vol. 20, No. 7, pp. 300-308 (1984) can also be used.

How these addition-polymerizable compounds are used, that is, what structure is used, whether they are used singly or in combination, and in which amount they are used, can be arbitrarily determined depending on the performance and design of the final planographic printing plate precursor. For example, they are selected from the following viewpoints. With respect to photosensitizing speed, their structure preferably has many unsaturated groups in one molecule, and in many cases, they are preferably bifunctional or more. To increase the strength of the part of an image i.e. the cured layer, they are preferably trifunctional or more. It is also effective to use a method of controlling both photosensitivity and strength by combined use of compounds (e.g. acrylates, methacrylates, styrene type compounds, and vinyl ether type compounds) having different functionalities and different polymerizable groups. The high-molecular compounds or highly hydrophobic compounds, though being excellent in photosensitizing speed and film strength, may be undesirable in some cases in view of the developing rate and precipitation in the developing solution. The method of selecting and using the addition-polymerizable compound is an important factor for compatibility and dispersibility with other components (e.g. a binder polymer, an initiator, a coloring agent etc.) in the photosensitive layer, and the compatibility may be improved by using e.g. a low-purity compound or a combination of two or more compounds. A specific structure can be selected for the purpose of improving adhesion to a substrate, an overcoat layer etc described later. The ratio of the addition-polymerizable compound blended in the photosensitive layer is advantageously higher for sensitivity, but a too high ratio causes undesirable phase separation, problems in production process caused by the adhesion of the photosensitive layer (e.g., defects in production process caused by transfer and adhesion of components in the photosensitive layer), and precipitation from the developing solution. From these viewpoints, the addition-polymerizable compounds are used in a range of preferably 5 to 80% by mass, and more preferably 25 to 75% by mass, based on nonvolatile components in the photosensitive layer. These compounds may be used singly or in combination thereof. From the viewpoints of the degree of inhibition of polymerization by oxygen, resolution, fogging, a change in reflectance, and surface adhesion, a suitable structure, compounding and addition amount thereof can be arbitrarily selected in the method of using the addition-polymerizable compound, and further a layer structure and a coating method such as undercoating and overcoating can also be carried out as needed.

(IR Absorber)

When the planographic printing plate precursor of the invention is used to form an image with a laser as a light source emitting infrared rays of 750 to 1,400 nm, it is usually necessary to use an IR absorber. The IR absorber has a function of converting absorbed infrared rays into heat. By this generated heat, a polymerization initiator (radical generating agent) described later is thermally decomposed to generate radicals. The IR absorber used in the invention is preferably a dye or pigment having a maximum absorption at a wavelength in a range of 750 to 1400 nm.

The dye may be any one of commercial dyes including known dyes described in e.g. "Senryo Binran" (Dye Handbook) (published in 1970 and compiled by Society of Synthetic Organic Chemistry, Japan). Examples of such dyes include azo dyes, metal complex salt azo dyes, pyrazolone azo dyes, naphthoquinone dyes, anthraquinone dyes, phthalocyanine dyes, carbonium dyes, quinone imine dyes, methine dyes, cyanine dyes, squarylium dyes, pyrylium salts and metal thiolate complexes.

Preferred dyes include e.g. cyanine dyes described in JP-A Nos. 58-125246, 59-84356, 59-202829, 60-78787 etc., methine dyes described in JP-A Nos. 58-173696, 58-181690, 58-194595 etc., naphthoquinone dyes described in JP-A Nos. 58-112793, 58-224793, 59-48187, 59-73996, 60-52940, 60-63744 etc., squarylium dyes described in JP-A No. 58-112792 etc., and cyanine dyes described in UK Patent No. 434,875.

Near infrared ray-absorbing sensitizers described in U.S. Pat. No. 5,156,938 are also preferably used. Also preferably used are substituted aryl benzo(thio) pyrylium salts described in U.S. Pat. No. 3,881,924, trimethine thiapyrylium salts described in JP-A No. 57-142645 (U.S. Pat. No. 4,327,169), pyrylium type compounds described in JP-A Nos. 58-181051, 58-220143, 59-41363, 59-84248, 59-84249, 59-146063, and 59-146061, cyanine dye described in JP-A No. 59-216146, pentamethine thiopyrylium salts described in U.S. Pat. No. 4,283,475, and pyrylium compounds described in JP-B Nos. 5-13514 and 5-19702. Other preferred examples of the dyes include the near infrared-absorbing dyes of formulae (I) and (II) described in U.S. Pat. No. 4,756,993.

Other preferred examples of the IR absorbing dye in the invention include specific indolenine cyanine dyes described in JP-A No. 2002-278057, as shown below.

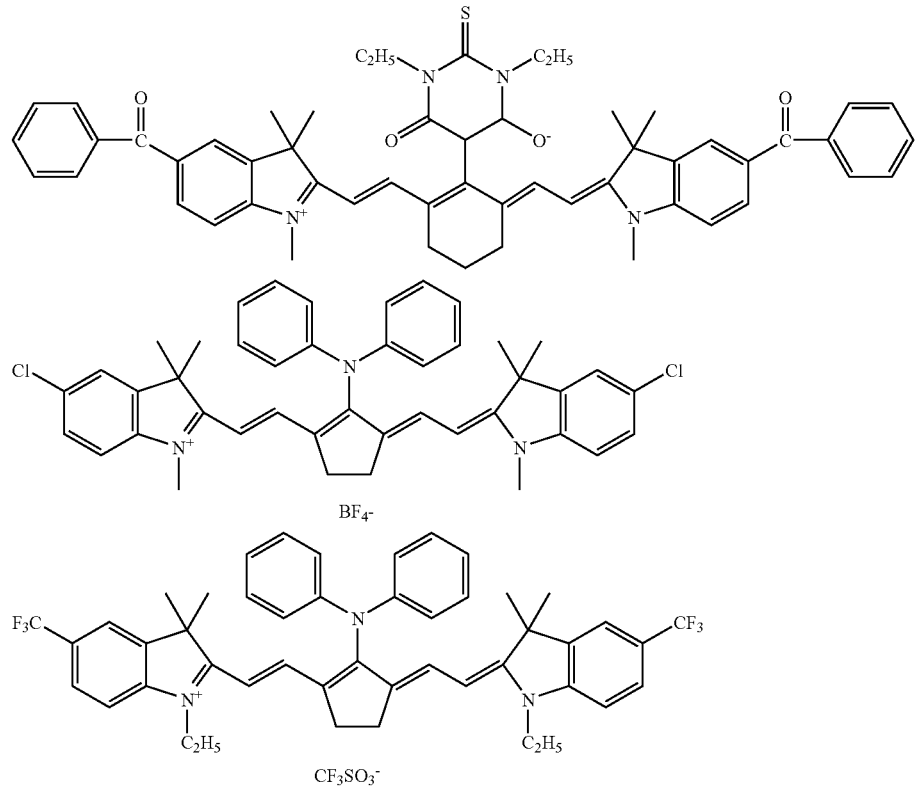

Particularly preferred among these dyes are cyanine dyes, squarylium dyes, pyrylium salts, nickel/thiolate complexes and indolenine cyanine dyes. The dyes are more preferably cyanine dyes and indolenine cyanine dyes, and particularly preferably cyanine dyes represented by formula (i):

Formula (i)

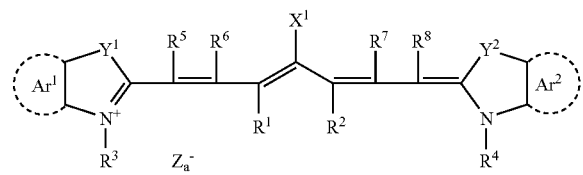

In the formula (i), $X^1$ represents a hydrogen atom, halogen atom, $-NPh_2$, $X^2-L^1$ or the group shown below. $X^2$ represents an oxygen atom, nitrogen atom or sulfur atom, $L^1$ represents a $C_{1-12}$ hydrocarbon, an aromatic ring having a heteroatom, and a $C_{1-12}$ hydrocarbon group containing a heteroatom. The heteroatom refers to N, S, O, halogen atom or Se. $Xa^-$ has the same meaning as that of $Z^{1-}$ defined later, and $R^a$ represents a substituent group selected from a hydrogen atom, alkyl group, aryl group, substituted or unsubstituted amino group, and halogen atom.

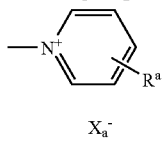

$R^1$ and $R^2$ independently represent a $C_{1-12}$ hydrocarbon group. For the shelf stability of the recording layer coating solution, each of $R^1$ and $R^2$ is preferably a hydrocarbon group containing 2 or more carbon atoms, and more preferably $R^1$ and $R^2$ are bound to each other to form a 5- or 6-memberred ring.

$Ar^1$ and $Ar^2$ may be the same or different, and represent an aromatic hydrocarbon group which may have a substituent group. The aromatic hydrocarbon group is preferably a benzene ring or naphthalene ring. The substituent group is preferably a hydrocarbon group containing 12 or less carbon atoms, a halogen atom or an alkoxy group containing 12 or less carbon atoms. $Y^1$ and $Y^2$ may be the same or different, and represent a sulfur atom or a dialkyl methylene group containing 12 or less carbon atoms. $R^3$ and $R^4$ may be the same or different, and represent a hydrocarbon group containing 20 or less carbon atoms, which may have a substituent group. The substituent group is preferably an alkoxy group containing 12 or less carbon atoms, a carboxyl group or a sulfo group. $R^5$, $R^6$, $R^7$ and $R^8$ may be the same or different, and represent a hydrogen atom or a hydrocarbon group containing 12 or less carbon atoms. Each of $R^5$, $R^6$, $R^7$ and $R^8$ is preferably a hydrogen atom because the starting material is easily available. $Za^-$ represents a counter anion. However, when the cyanine dye represented by the formula (i) has an anionic substituent group in its structure and does not necessitate neutralization of the charge, $Za^-$ is not necessary. Because of the shelf stability of the recording layer coating solution, $Za^-$ is preferably a halogen ion, perchlorate ion, tetrafluoroborate ion, hexafluorophosphate ion or sulfonate ion, particularly preferably a perchlorate ion, hexafluorophosphate ion or aryl sulfonate ion.

Examples of the cyanine dyes represented by the formula (i), which can be preferably used in the invention, include those described in columns [0017] to [0019] in JP-A No. 2001-133969.

Other preferred examples of the IR absorber in the invention include specific indolenine cyanine dyes described in above-mentioned JP-A No. 2002-278057.

The pigment which can be used in the invention includes commercial pigments and those described in Color Index (C.I.) Handbook, "Saishin Ganryo Binran" (Newest Dye Handbook) (published in 1977 and compiled by Japanese Society of Pigment Technology), "Saishin Ganryho Oyo Gijyutsu" (Newest Pigment Applied Technology) (published in 1986 by CMC), and "Insatsu Inki Gijyutsu" (Printing Ink Technology) (published in 1984 by CMC).

As the type of pigment, mention is made of black pigments, yellow pigments, orange pigments, brown pigments, red pigments, violet pigments, blue pigments, green pigments, fluorescent pigments, metallic powder pigments, and other pigments such as polymer-binding dyes. Specifically, it is possible to use insoluble azo pigments, azo lake pigments, condensed azo pigments, chelate azo pigments, phthalocyanine type pigments, anthraquinone type pigments, perylene and perinone type pigments, thioindigo type pigments, quinacridone type pigments, dioxazine type pigments, isoindolinone type pigments, quinophthalone type pigments, dyed lake pigments, azine pigments, nitroso pigments, nitro pigments, natural pigments, fluorescent pigments, inorganic pigments, carbon black etc. A preferred pigment among those described above is carbon black.

The pigments used may or may not be subjected to surface treatment. The method of surface treatment includes a method of coating the surface thereof with resin or wax, a method of allowing a surfactant to adhere thereto, and a method of bonding a reactive material (e.g., a silane coupling agent, an epoxy compound, a polyisocyanate etc.) onto the surface of the pigment. These methods of surface treatment are described in "Kinzoku Sekken No Seishitsu To Oyo" (Properties and Application of Metallic Soap) (Sachi Shobo), "Insatsu Inki Gijyutsu" (Printing Ink Technology) (published in 1984 by CMC Shuppan) and "Saishin Ganryho Oyo Gijyutsu" (Newest Pigment Applied Technology) (published in 1986 by CMC Shuppan).

The particle diameters of the pigments are in a range of preferably 0.01 to 10 μm, more preferably 0.05 to 1 μm, and most preferably 0.1 to 1 μm. A pigment particle diameter of less than 0.01 μm is not preferred in view of the stability of a pigment dispersion in the photosensitive layer coating solution, whereas a particle diameter of more than 10 μm is not preferred in view of the uniformity of the photosensitive layer.

As the method of dispersing the pigments, any known dispersion techniques used in production of inks or toners can be used. As the dispersing machine, mention is made of a supersonic dispersing device, sand mill, attritor, pearl mill, super mill, ball mill, impeller, disperser, KD mill, colloid mill, dynatron, triple roll mill, press kneader etc. These are described in detail in "Saishin Ganryho Oyo Gijyutsu" (Newest Pigment Applied Technology) (published in 1986 by CMC Shuppan).

The IR absorber may be added to the same layer together with other components, or added to a separately provided layer. The absorbance of the photosensitive layer at the wavelength of the maximum absorption in a range of 760 to 1200 nm is preferably 0.5 to 1.2, and more preferably 0.6 to 1.15 measured by a reflection measurement method. The absorbance can be controlled by the added amount of an IR absorber in the production process of a negative-type planographic printing precursor. When the absorbance is outside of this range, the strength of an image region may be lowered to reduce the number of prints at the time of printing. The reason therefor is not evident, but is possibly that when the absorbance is less than 0.5, the photosensitive layer cannot sufficiently absorb irradiated IR rays, and as a result, the radical polymerization of the whole of the photosensitive layer does not sufficiently proceed, while when the absorbance is higher than 1.2, only the outermost surface of the photosensitive layer absorbs IR rays, and therefore the IR rays do not reach a region near the substrate, and as a result, the radical polymerization does not occur in the vicinity of the substrate, thus leading to deficient adhesiveness of the substrate to the photosensitive layer.

The absorbance of the photosensitive layer can be controlled by the amount of the IR absorber added to the photosensitive layer and the thickness of the photosensitive layer. The absorbance can be measured in a usual manner. The measurement method includes, for example, a method wherein the photosensitive layer whose thickness is determined suitably in a necessary range of the amount to be applied after drying for the planographic printing plate precursor is formed on a reflective substrate such as aluminum, and then measured for reflection density by an optical densitometer, or a method of measuring density with a spectrophotometer by a reflection method using an integrating sphere.

(Polymerization Initiator)

As the polymerization initiator for initiation and progress of the curing reaction of the polymerizable compound, a thermally decomposed radical generating agent which is decomposed by heat to generate radicals is useful. The radical-generating agent is used in combination with the IR absorber described above to generate radicals by the heat energy evolved by the IR absorber upon irradiation with an IR laser, and by this combination, heat-mode recording is feasible.

The radical generating agent includes onium salts, triazine compounds having a trihalomethyl group, peroxides, azo-type polymerization initiators, azide compounds and quinone diazide, among which the onium salts are highly sensitive and preferred. Hereinafter, the onium salts which can be used preferably as the radical polymerization initiator in the invention are described. Preferred examples of the onium salts include iodonium salts, diazonium salts and sulfonium salts. In the invention, these onium salts function not as acid generating agents but as radical polymerization initiators. The onium salts used preferably in the invention are onium salts represented by formulae (III) to (V):

$$Ar^{11}-I^+-Ar^{12} Z^{11-} \quad \text{Formula (III)}$$

$$Ar^{21}-N^+\equiv N \, Z^{21-} \quad \text{Formula (IV)}$$

Formula (V)

In the formula (III), $Ar^{11}$ and $Ar^{12}$ independently represent an aryl group containing 20 or less carbon atoms, which may have a substituent group. When this aryl group has a substituent group, the substituent group is preferably a halogen atom, a nitro group, an alkyl group containing 12 or less carbon atoms, an alkoxy group containing 12 or less carbon atoms, or an aryloxy group containing 12 or less carbon atoms. $Z^{11-}$ represents a counter ion selected from the group consisting of a halogen ion, perchlorate ion, tetrafluoroborate ion, hexafluorophosphate ion, carboxylate ion and sulfonate ion, preferably a perchlorate ion, hexafluorophosphate ion, carboxylate ion and aryl sulfonate ion.

In the formula (IV), $Ar^{21}$ represents an aryl group containing 20 or less carbon atoms, which may have a substituent group. The substituent is preferably a halogen atom, a nitro group, an alkyl group containing 12 or less carbon atoms, an alkoxy group containing 12 or less carbon atoms, an aryloxy group containing 12 or less carbon atoms, an alkylamino group containing 12 or less carbon atoms, a dialkyl amino group containing 12 or less carbon atoms, an aryl amino group containing 12 or less carbon atoms, or a diaryl amino group containing 12 or less carbon atoms. $Z^{21-}$ represents a counter ion having the same meaning as defined for $Z^{11-}$.

In the formula (V), $R^{31}$, $R^{32}$ and $R^{33}$ may be the same or different, and represent a hydrocarbon group containing 20 or less carbon atoms, which may have a substituent group. The substituent is preferably a halogen atom, a nitro group, an alkyl group containing 12 or less carbon atoms, an alkoxy group containing 12 or less carbon atoms or an aryloxy group containing 12 or less carbon atoms. $Z^{31-}$ represents a counter ion having the same meaning as defined for $Z^{11-}$.

Examples of the onium salts that can be used preferably as the radical-generating agent in the invention include those described in JP-A No. 2001-133696. Hereinafter, examples of the onium salts ([OI-1] to [OI-10]) represented by the formula (III), the onium salts ([ON-1] to [ON-5]) represented by the formula (IV) and the onium salts ([OS-1] to [OS-7]) represented by the formula (V) are mentioned, but the onium salts are not limited thereto.

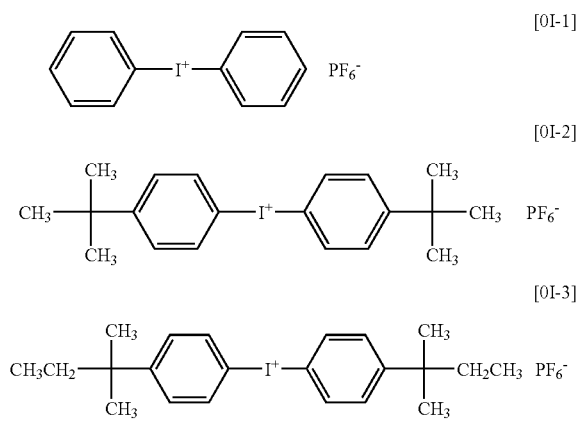

-continued
[0I-4]
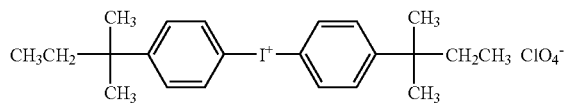
[0I-5]
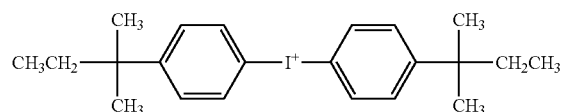
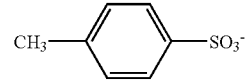
[0I-6]
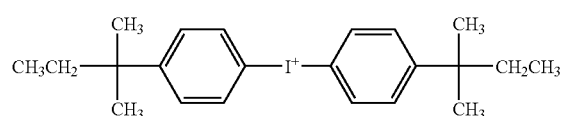
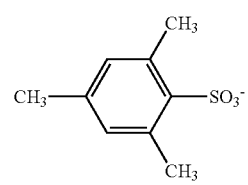
[0I-7]
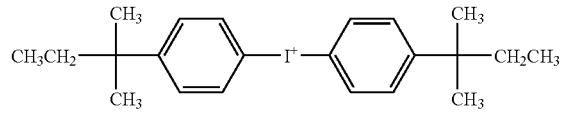
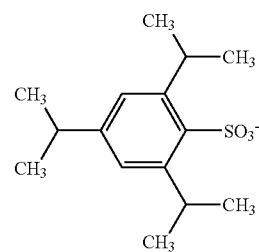
[0I-8]
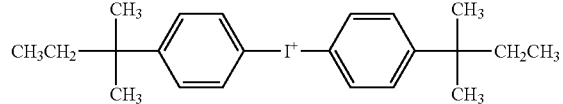
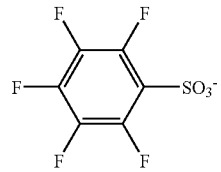
[0I-9]
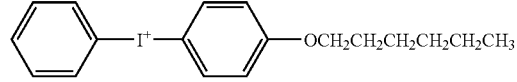
[0I-10]
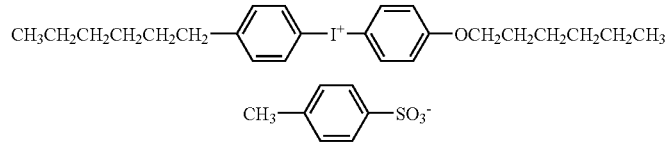

-continued
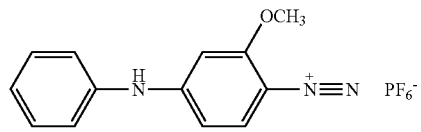
[ON-1]
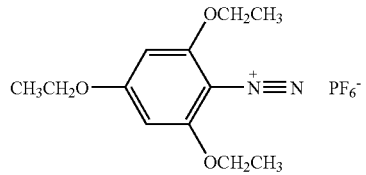
[ON-2]
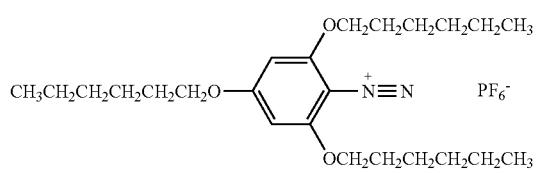
[ON-3]
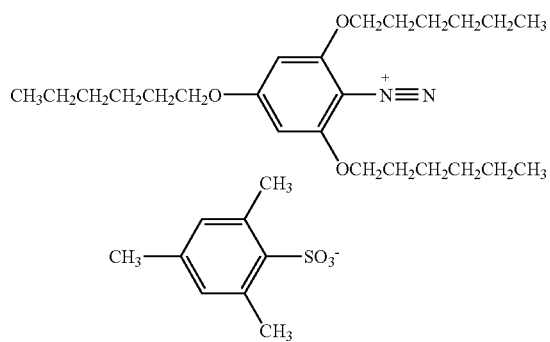
[ON-4]
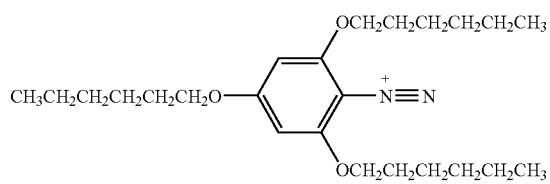
[ON-5]
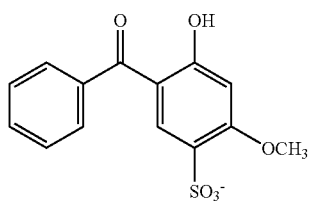
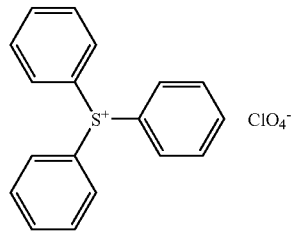
[OS-1]

-continued
[OS-2]
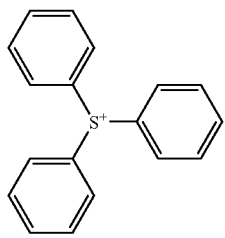 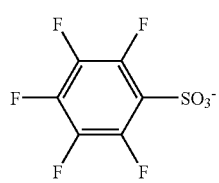
[OS-3]
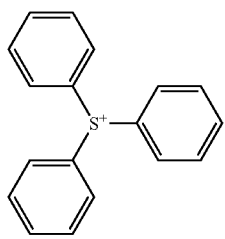 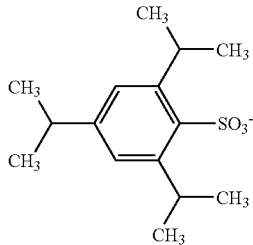
[OS-4]
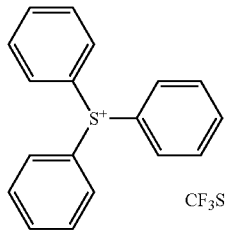
[OS-5]
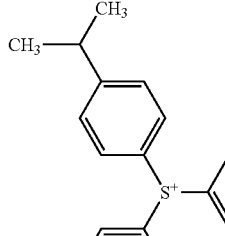
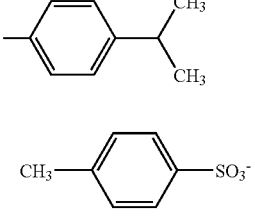
[OS-6]
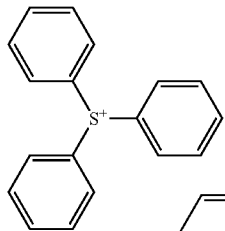
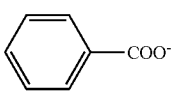

-continued

[OS-7]

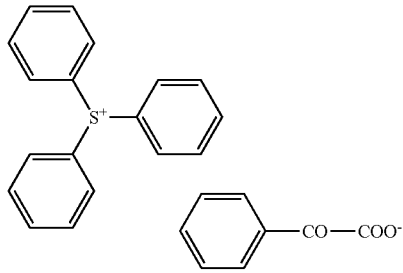

The radical-generating agent used in the invention has a maximum absorption wavelength of preferably 400 nm or less, and more preferably 360 nm or less. By using the radical-generating agent having its absorption wavelength in the UV range, the planographic printing plate precursor can be handled under white light.

Other preferred polymerization initiators include specific aromatic sulfonium salts described in JP-A Nos. 2002-148790, 2001-343742 and 2002-006482.

As other preferred polymerization initiators usable in the invention, typical compounds described in JP-A Nos. 2002-148790 and 2002-148790 are shown below:

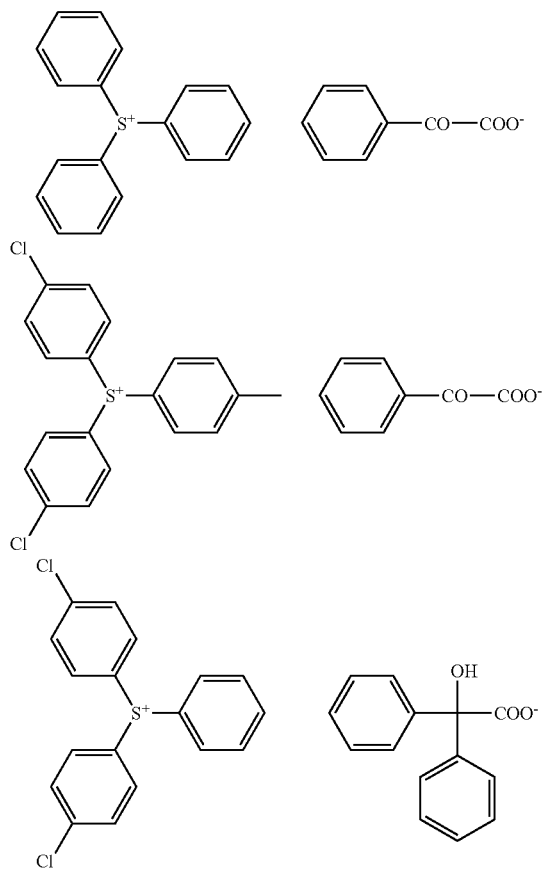

The polymerization initiator can be added in an amount 0.1 to 50% by mass, preferably 0.5 to 30% by mass, particularly preferably 1 to 20% by mass, based on the total solids content of the photosensitive layer. When the amount of the polymerization initiator added is less than 0.1% by mass, the sensitivity is lowered, while when the amount is higher than 50% by mass, a non-image region may be easily stained in printing. These polymerization initiators may be used alone or as a mixture of two or more thereof. The polymerization initiator, along with other components, may be added to the same layer or to a separately provided layer.

(Binder Polymer)

As the binder polymer used in the photosensitive layer in the planographic printing plate precursor of the invention, any known binder polymers can be used without limitation, and specifically an acrylic main-chain binder and an urethane binder used frequently in this field are preferably used.

The acid value (meq/g) of the binder polymer is preferably in a range of 2.00 to 3.60.

The binder polymer usable in the invention is preferably a binder polymer having a radical-polymerizable group. The radical-polymerizable group is not particularly limited insofar as it can be polymerized with a radical, and examples thereof include α-substituted methyl acryl group [—OC(=O)—C(—CH$_2$Z)=CH$_2$ wherein Z is a hydrocarbon group starting from a heteroatom], acryl group, methacryl group, allyl group and styryl group, among which an acryl group and methacryl group are preferred.

The content of the radical-polymerizable group in the binder polymer (content of radical-polymerizable unsaturated double bonds determined by iodine titration) is preferably 0.1 to 10.0 mmol, more preferably 1.0 to 7.0 mmol, and most preferably 2.0 to 5.5 mmol, per g of the binder polymer. When this content is lower than 0.1 mmol, curing properties may be deteriorated to lower sensitivity. When the content is higher than 10.0 mmol, stability may be lost and shelf stability may be deteriorated.

Preferably, the binder polymer further has an alkali-soluble group. The content of the alkali-soluble group (acid value determined by neutralization titration) in the binder polymer is preferably 0.1 to 3.0 mmol, more preferably 0.2 to 2.0 mmol, and most preferably 0.45 to 1.0 mmol, per g of the binder polymer. When the content is lower than 0.1 mmol, the binder polymer may be precipitated during development to generate development leavings. When the content is higher than 3.0 mmol, the hydrophilicity of the binder polymer may be too high, thus deteriorating printing press life.

The weight-average molecular weight of the binder polymer is in a range of preferably 2,000 to 1,000,000, more preferably 10,000 to 300,000, and most preferably 20,000 to 200,000. When the weight-average molecular weight is less than 2,000, the layer-forming property may be lowered to deteriorate printing press life. When the weight-average molecular weight is greater than 1,000,000, the binder polymer may be hardly dissolved in a coating solvent to lower coating property.

The glass transition point (Tg) of the binder polymer is in a range of preferably 70 to 300° C., more preferably 80 to 250° C., and most preferably 90 to 200° C. When the glass transition point is lower than 70° C., shelf stability may be lowered to deteriorate printing press life. When the glass transition point is higher than 300° C., the transferability of radicals in the photosensitive layer may be lowered to make sensitivity low.

As a means of increasing the glass transition point of the binder polymer, its molecule preferably contains an amide group or imide group, and particularly preferably contains methacrylamide methacrylamide derivatives.

These binder polymers may be used alone or as a mixture of two or more thereof.

The total amount of the binder polymers usable in the photosensitive layer in the invention can be predetermined suitably, and the amount is usually in a range of 10 to 90% by mass, preferably 20 to 80% by mass, and more preferably 30 to 70% by mass based on the total weight of non-volatile components in the photosensitive layer.

Among the binder polymers in the invention, a binder polymer having a repeating unit represented by formula (I) below is particularly preferred.

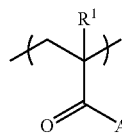

Formula (I)

In formula (I), $R^1$ represents a hydrogen atom or a methyl group; $R^2$ represents a linking group composed of atoms selected from carbon atoms, hydrogen atoms, oxygen atoms, nitrogen atoms, sulfur atoms and halogen atoms, wherein the number of atoms excluding atoms in a substituent group is 2 to 30; A represents an oxygen atom or —$NR^3$—; $R^3$ represents a hydrogen atom or a $C_{1-10}$ monovalent hydrocarbon group; and n is an integer from 1 to 5.

The binder polymer having a repeating unit represented by the formula (I) is also referred to as specific binder polymer and described in more detail below.

$R^1$ in the formula (I) represents a hydrogen atom or a methyl group, preferably a methyl group.

The linking group represented by $R^2$ in the formula (I) is composed of atoms selected from hydrogen atoms, oxygen atoms, nitrogen atoms, sulfur atoms and halogen atoms, wherein the number of atoms excluding atoms in a substituent group is 2 to 30. Examples thereof include alkylene, substituted alkylene, arylene and substituted arylene, and these divalent groups may be in a chain structure bound to one another via amide or ester linkages.

Linking groups in the chain structure include ethylene, propylene etc. A structure comprising these alkylene groups bound to one another via ester linkages is also preferred.

The linking group represented by $R^2$ in the formula (I) is preferably a (n+1)-valent hydrocarbon group having a $C_{3-30}$ alicyclic structure. Examples thereof include (n+1)-valent hydrocarbon groups obtained by removing (n+1) hydrogen atoms on arbitrary carbon atoms constituting compounds having an alicyclic structure, such as cyclopropane, cyclopentane, cyclohexane, cycloheptane, cyclooctane, cyclodecane, dicyclohexyl, tertiary cyclohexyl and norbornane which may be substituted with one or more arbitrary substituent groups. $R^2$ is preferably the one containing 3 to 30 carbon atoms including carbon atoms in a substituent group if any.

The arbitrary carbon atoms constituting compounds having an alicyclic structure may be substituted with one or more heteroatoms selected from the group consisting of a nitrogen atom, an oxygen atom and a sulfur atom. With respect to printing press life, $R^2$ is preferably a (n+1)-valent hydrocarbon group having an alicyclic structure which may have a $C_{5-30}$ substituent group comprising two or more rings, such as a condensed polycyclic aliphatic hydrocarbon, a crosslinked alicyclic hydrocarbon, spiroaliphatic hydrocarbon, and combined aliphatic hydrocarbon rings (rings combined directly or via linking groups). The number of carbon atoms refers to the number of carbon atoms including carbon atoms in a substituent group if any.

The linking group represented by $R^2$ is preferably a $C_{5-10}$ group having a chain structure containing an ester linkage or the cyclic structure described above.

A substituent group which can be introduced into the linking group represented by $R^2$ includes a monovalent non-metal atomic group excluding hydrogen, and examples thereof include a halogen atom (—F, —Br, —Cl, —I), hydroxyl group, alkoxy group, aryloxy group, mercapto group, alkyl thio group, aryl thio group, alkyl dithio group, aryl dithio group, amino group, N-alkyl amino group, N,N-dialkyl amino group, N-aryl amino group, N,N-diaryl amino group, N-alkyl-N-aryl amino group, acyloxy group, carbamoyloxy group, N-alkylcarbamoyloxy group, N-aryl carbamoyloxy group, N,N-dialkyl carbamoyloxy group, N,N-diaryl carbamoyloxy group, N-alkyl-N-aryl carbamoyloxy group, alkyl sulfoxy group, aryl sulfoxy group, acyl thio group, acyl amino group, N-alkyl acyl amino group, N-aryl acyl amino group, ureido group, N'-alkyl ureido group, N',N'-dialkyl ureido group, N'-aryl ureido group, N',N'-diaryl ureido group, N'-alkyl-N'-aryl ureido group, N-alkyl ureido group, N-aryl ureido group, N'-alkyl-N-alkyl ureido group, N'-alkyl-N-aryl ureido group, N',N'-dialkyl-N-alkyl ureido group, N',N'-dialkyl-N-aryl ureido group, N'-aryl-N-alkyl ureido group, N'-aryl-N-aryl ureido group, N',N'-diaryl-N-alkyl ureido group, N',N'-diaryl-N-aryl ureido group, N'-alkyl-N'-aryl-N-alkyl ureido group, N'-alkyl-N'-aryl-N-aryl ureido group, alkoxy carbonyl amino group, aryloxy carbonyl amino group, N-alkyl-N-alkoxycarbonyl amino group, N-alkyl-N-aryloxy carbonyl amino group, N-aryl-N-alkoxycarbonyl amino group, N-aryl-N-aryloxycarbonyl amino group, formyl group, acyl group, carboxyl group and its conjugated basic group, alkoxy carbonyl group, aryloxy carbonyl group, carbamoyl group, N-alkyl carbamoyl group, N,N-dialkyl carbamoyl group, N-aryl carbamoyl group, N,N-diaryl carbamoyl group, N-alkyl-N-aryl carbamoyl group, alkyl sulfinyl group, aryl sulfinyl group, alkyl sulfonyl group, aryl sulfonyl group, sulfo group (—$SO_3H$) and its conjugated basic group, alkoxy sulfonyl group, aryloxy sulfonyl group, sulfinamoyl group, N-alkyl sulfinamoyl group, N,N-dialkyl sulfinamoyl group, N-aryl sulfinamoyl group, N,N-diaryl sulfinamoyl group, N-alkyl-N-aryl sulfinamoyl group, sulfamoyl group, N-alkyl sulfamoyl group, N,N-dialkyl sulfamoyl group, N-aryl sulfamoyl group, N,N-diaryl sulfamoyl group, N-alkyl-N-aryl sulfamoyl group, N-acyl sulfamoyl group and its conjugated basic group, N-alkyl sulfonyl sulfamoyl group (—$SO_2NHSO_2$(alkyl)) and its conjugated basic group, N-aryl sulfonyl sulfamoyl group (—$SO_2NHSO_2$(aryl)) and its conjugated basic group, N-alkyl sulfonyl carbamoyl group (—$CONHSO_2$(alkyl)) and its conjugated basic group, N-aryl sulfonyl carbamoyl group (—$CONHSO_2$(aryl)) and its conjugated basic group, alkoxy silyl group (—$Si(O-alkyl)_3$), aryloxy silyl group (—$Si(O-aryl)_3$), hydroxylyl group (—$Si(OH)_3$) and its conjugated basic group, pohsphono group (—$PO_3H_2$) and its conjugated basic group, dialkyl phosphono group (—$PO_3(alkyl)_2$), diaryl phosphono group (—$PO_3(aryl)_2$), alkyl aryl phosphono group (—$PO_3(alkyl)(aryl)$), monoalkyl phosphono group (—$PO_3H(alkyl)$) and its conjugated basic group, monoaryl phosphono group (—$PO_3H(aryl)$) and its conjugated basic group, phosphonoxy group (—$OPO_3H_2$) and its conjugated basic group, dialkyl phosphonoxy group (—$OPO_3(alkyl)_2$), diaryl phosphonoxy group (—OPO₃(aryl)₂), alkyl aryl phosphonoxy group (—OPO₃(alkyl)(aryl)), monoalkyl phosphonoxy group (—OPO₃H(alkyl)) and its conjugated basic group, monoaryl phosphonoxy group (—OPO₃H(aryl)) and its conjugated basic group, cyano group, nitro group, dialkyl boryl group (—B(alkyl)₂), diaryl boryl group (—B(aryl)₂), alkyl aryl boryl group (—B(alkyl)(aryl)), dihydroxy boryl group (—B(OH)₂) and its conjugated basic group, alkyl hydroxy boryl group (—B(alkyl)(OH)) and its conjugated basic group, aryl hydroxy boryl group (—B(aryl)(OH)) and its conjugated basic group, aryl group, alkenyl group and alkynyl group.

Depending on the design of the photosensitive layer, a substituent group having a hydrogen atom capable of hydrogen bonding, particularly a substituent group having acidity whose acid dissociation constant (pKa) is lower than that of carboxylic acid, is not preferred because it tends to lower printing press life. On the other hand, a hydrophobic substituent group such as a halogen atom, a hydrocarbon group (alkyl group, aryl group, alkenyl group, alkynyl group), an alkoxy group and an aryloxy group is preferred because it tends to improve printing press life, and particularly when the cyclic structure is a 6- or less memberred monocyclic aliphatic hydrocarbon such as cyclopentane or cyclohexane, the hydrocarbon preferably has such hydrophobic substituent groups. If possible, these substituent groups may be bound to one another or to a substituted hydrocarbon group to form a ring, and the substituent groups may further be substituted.

When A in the formula (I) is $NR^3$—, $R^3$ represents a hydrogen atom or a $C_{1-10}$ monovalent hydrocarbon group. The $C_{1-10}$ monovalent hydrocarbon group represented by $R^3$ includes an alkyl group, aryl group, alkenyl group and alkynyl group.

Examples of the alkyl group include a $C_{1-10}$ linear, branched or cyclic alkyl group such as a methyl group, ethyl group, propyl group, butyl group, pentyl group, hexyl group, heptyl group, octyl group, nonyl group, decyl group, isopropyl group, isobutyl group, sec-butyl group, tert-butyl group, isopentyl group, neopentyl group, 1-methylbutyl group, isohexyl group, 2-ethylhexyl group, 2-methylhexyl group, cyclopentyl group, cyclohexyl group, 1-adamanthyl group and 2-norbornyl group.

Examples of the aryl group include a $C_{1-10}$ aryl group such as a phenyl group, naphthyl group and indenyl group, a $C_{1-10}$ heteroaryl group containing one heteroatom selected from the group consisting of a nitrogen atom, an oxygen atom and a sulfur atom, for example a furyl group, thienyl group, pyrrolyl group, pyridyl group and quinolyl group.

Examples of the alkenyl group include a $C_{1-10}$ linear, branched or cyclic alkenyl group such as a vinyl group, 1-propenyl group, 1-butenyl group, 1-methyl-1-propenyl group, 1-cyclopentenyl group and 1-cyclohexenyl group.

Examples of the alkynyl group include a $C_{1-10}$ alkynyl group such as an ethynyl group, 1-propynyl group, 1-butynyl group and 1-octynyl group. Substituent groups which may be possessed by $R^3$ include the same substituent groups as those capable of being introduced into $R^2$. The number of carbon atoms in $R^3$, including the number of carbon atoms in its substituent group, is 1 to 10.

A in the formula (I) is preferably an oxygen atom or —NH— in view of easy synthesis.

n in the formula (I) is an integer from 1 to 5, preferably 1 in view of printing press life.

Preferred examples of the repeating unit represented by the formula (I) in the specific binder polymer are shown below, but the invention is not limited thereto.

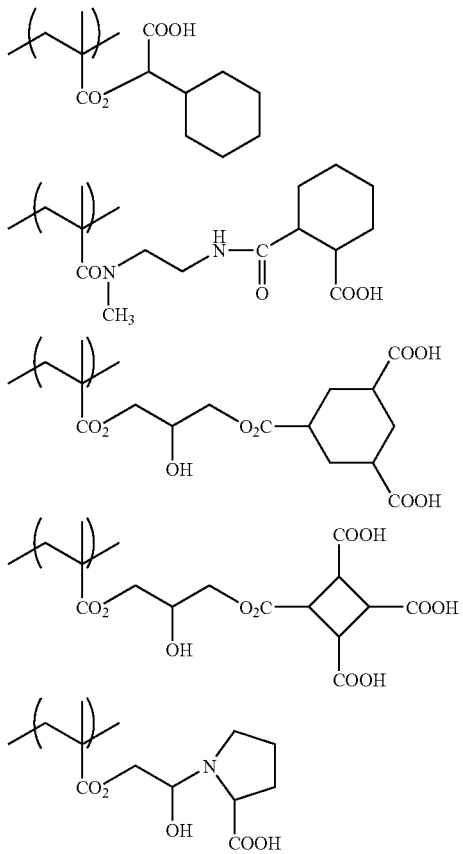

-continued
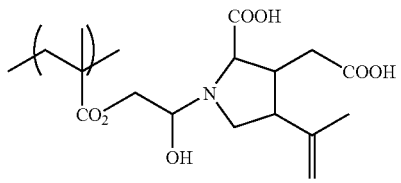
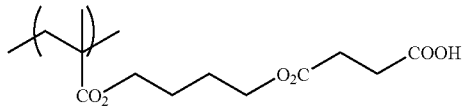
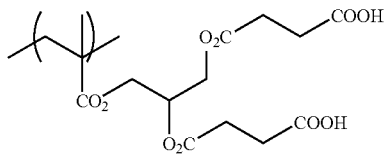
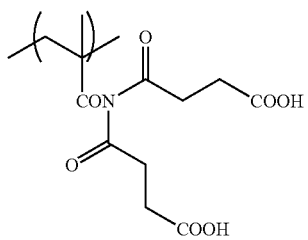
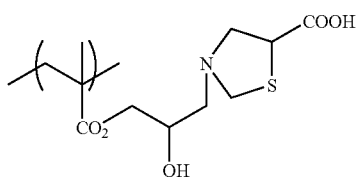
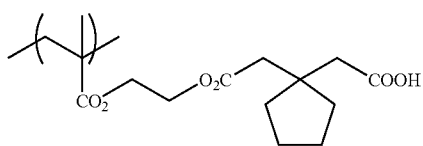
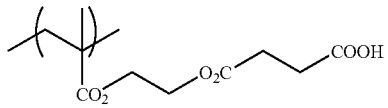
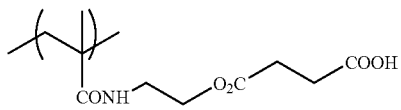
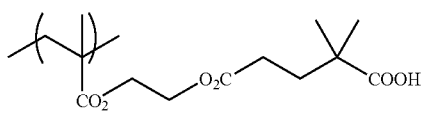
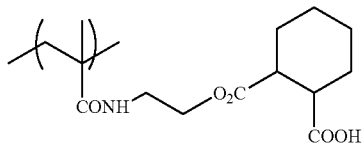
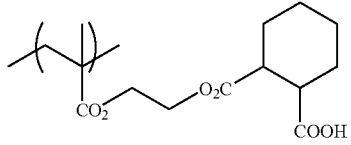

-continued
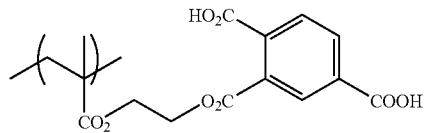
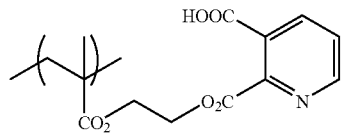
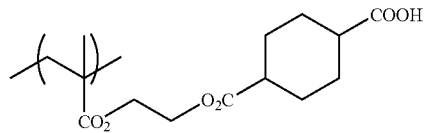
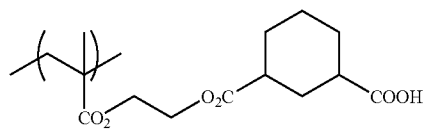
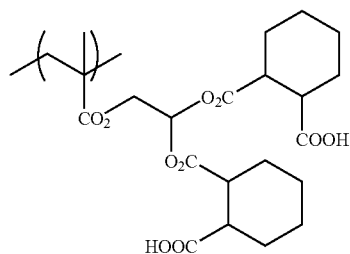
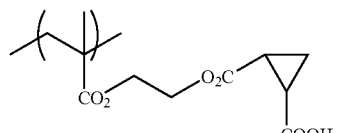
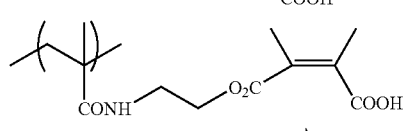
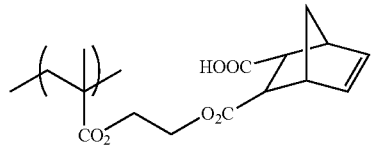
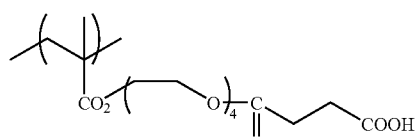
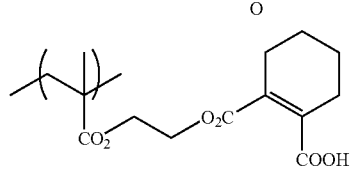
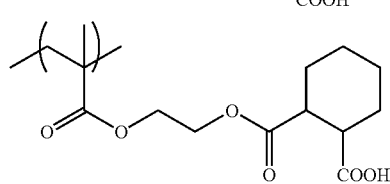

-continued
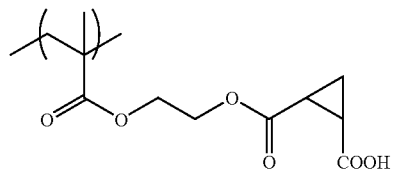
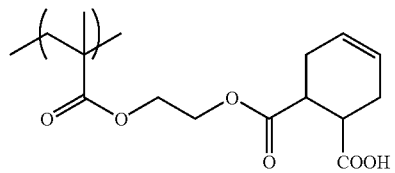
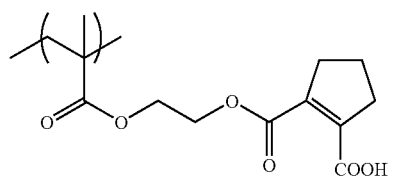
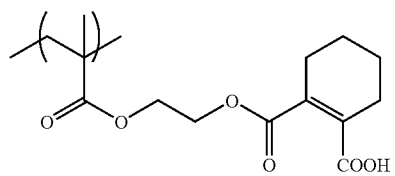
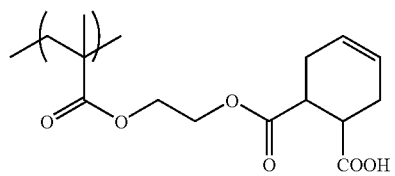
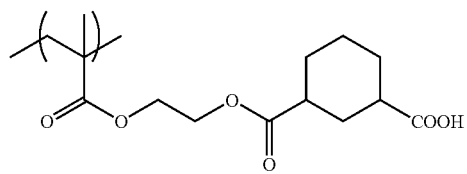
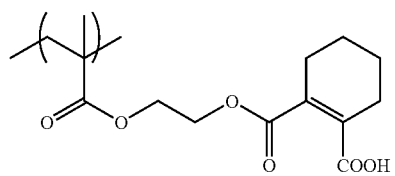
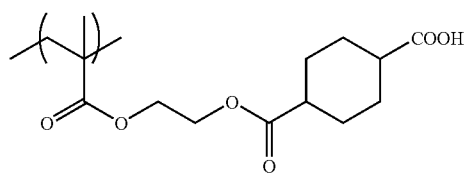
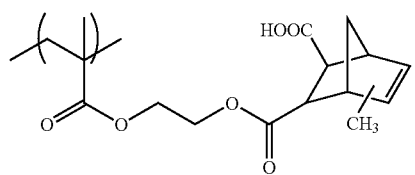

-continued
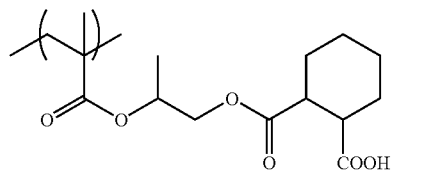
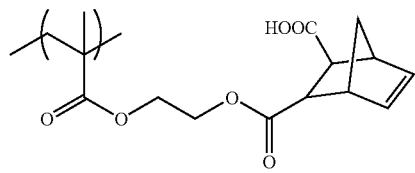
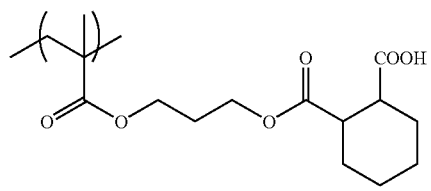
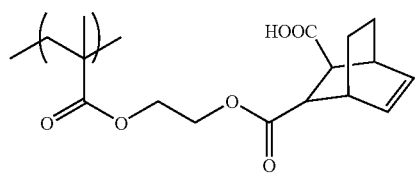
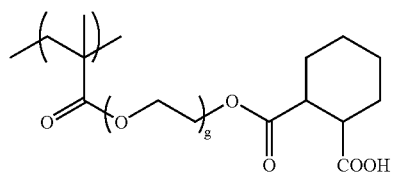
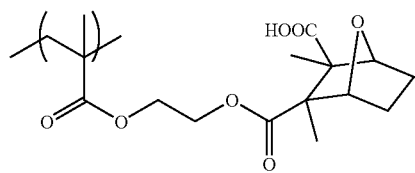
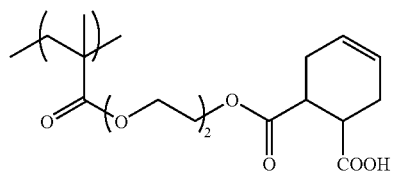
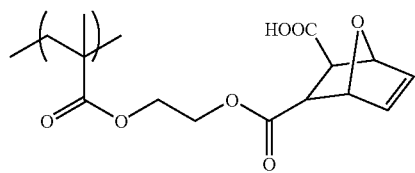
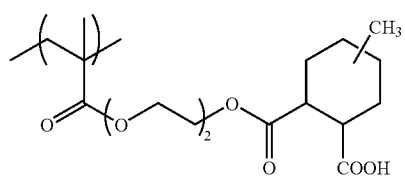

-continued
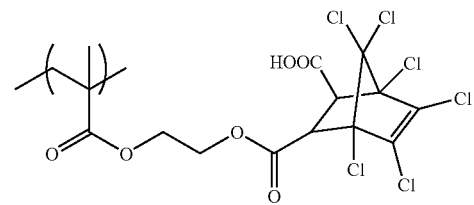
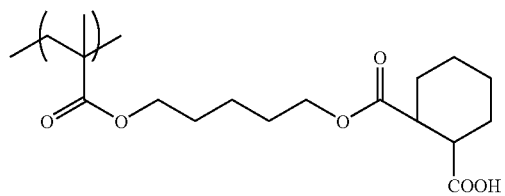
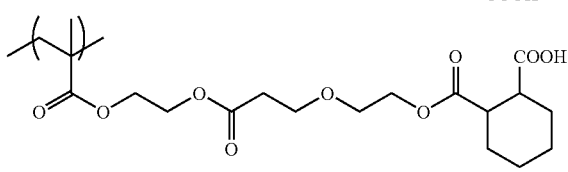
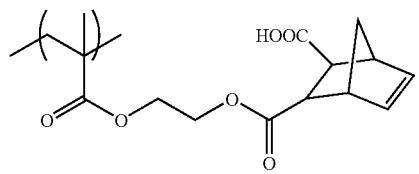
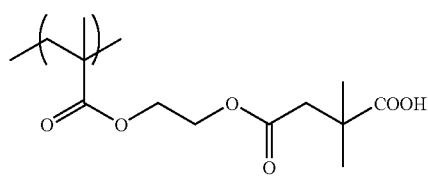
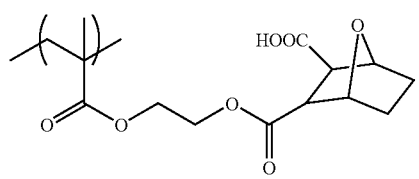
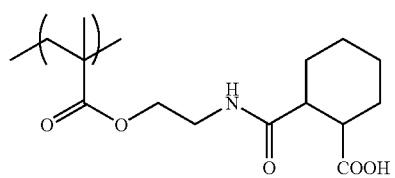
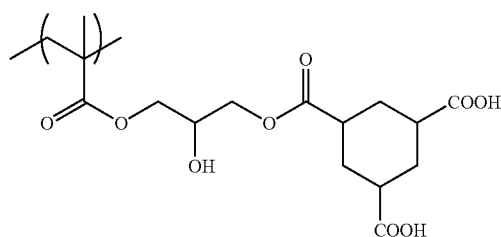
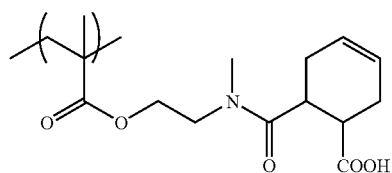

-continued
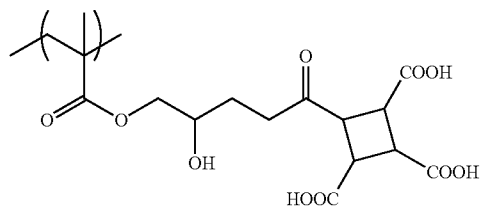
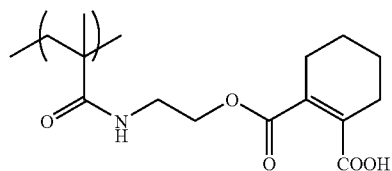
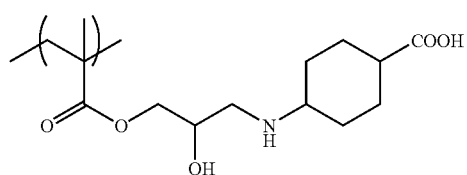
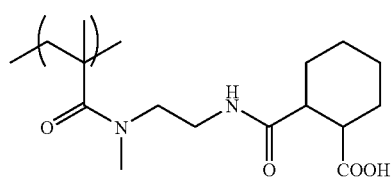
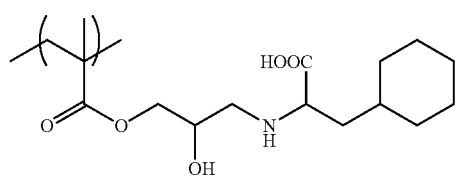
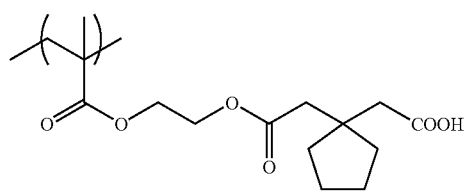
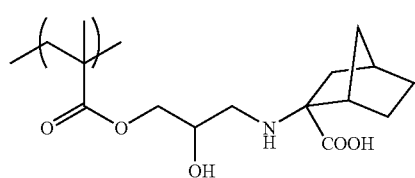
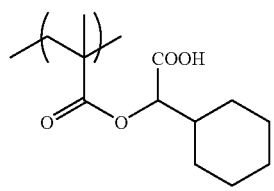
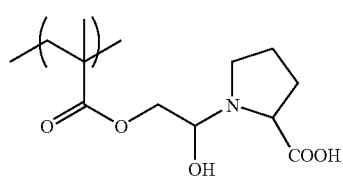

-continued
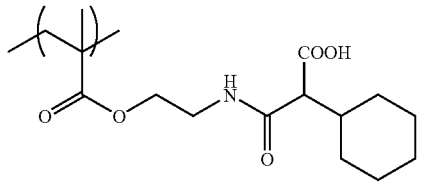
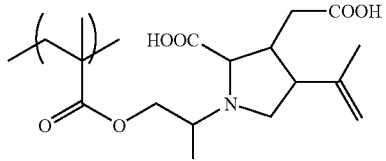
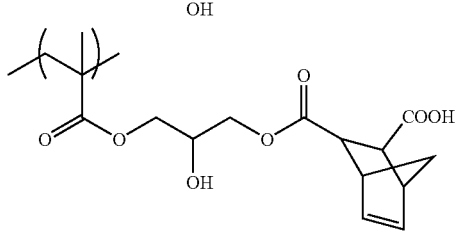
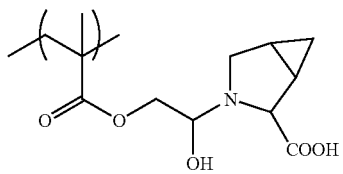
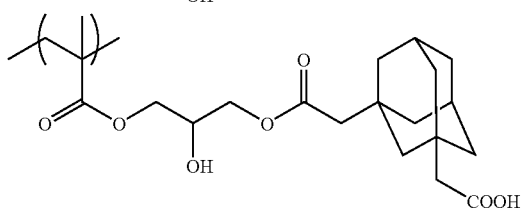
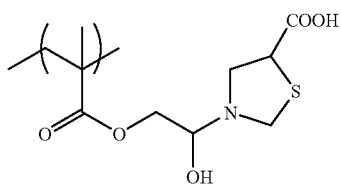
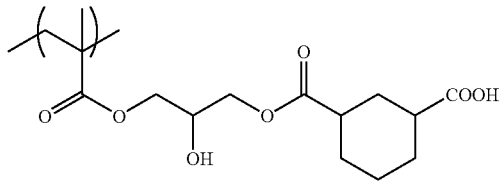
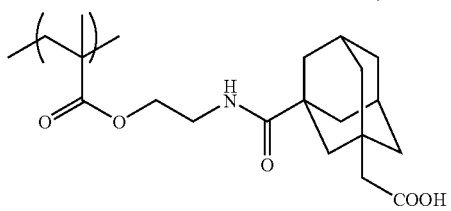
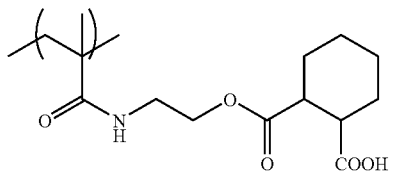

-continued
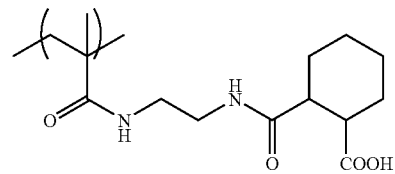
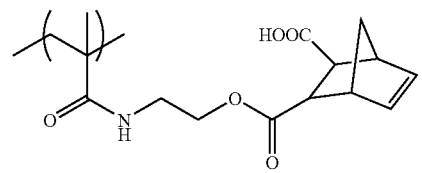
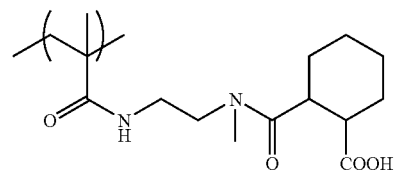
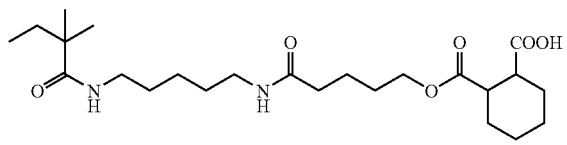
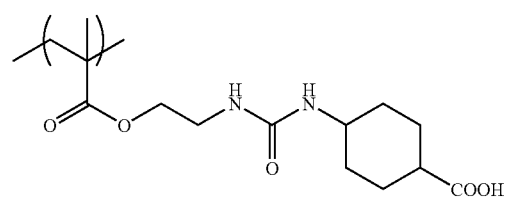
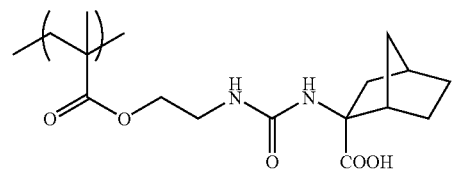
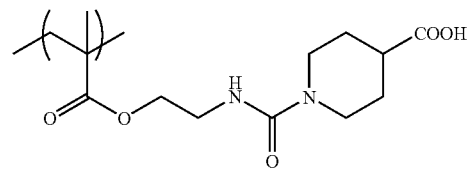
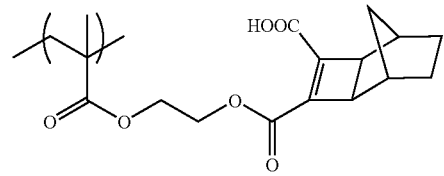
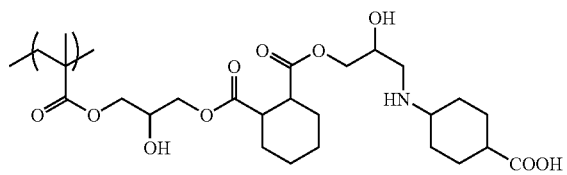

-continued

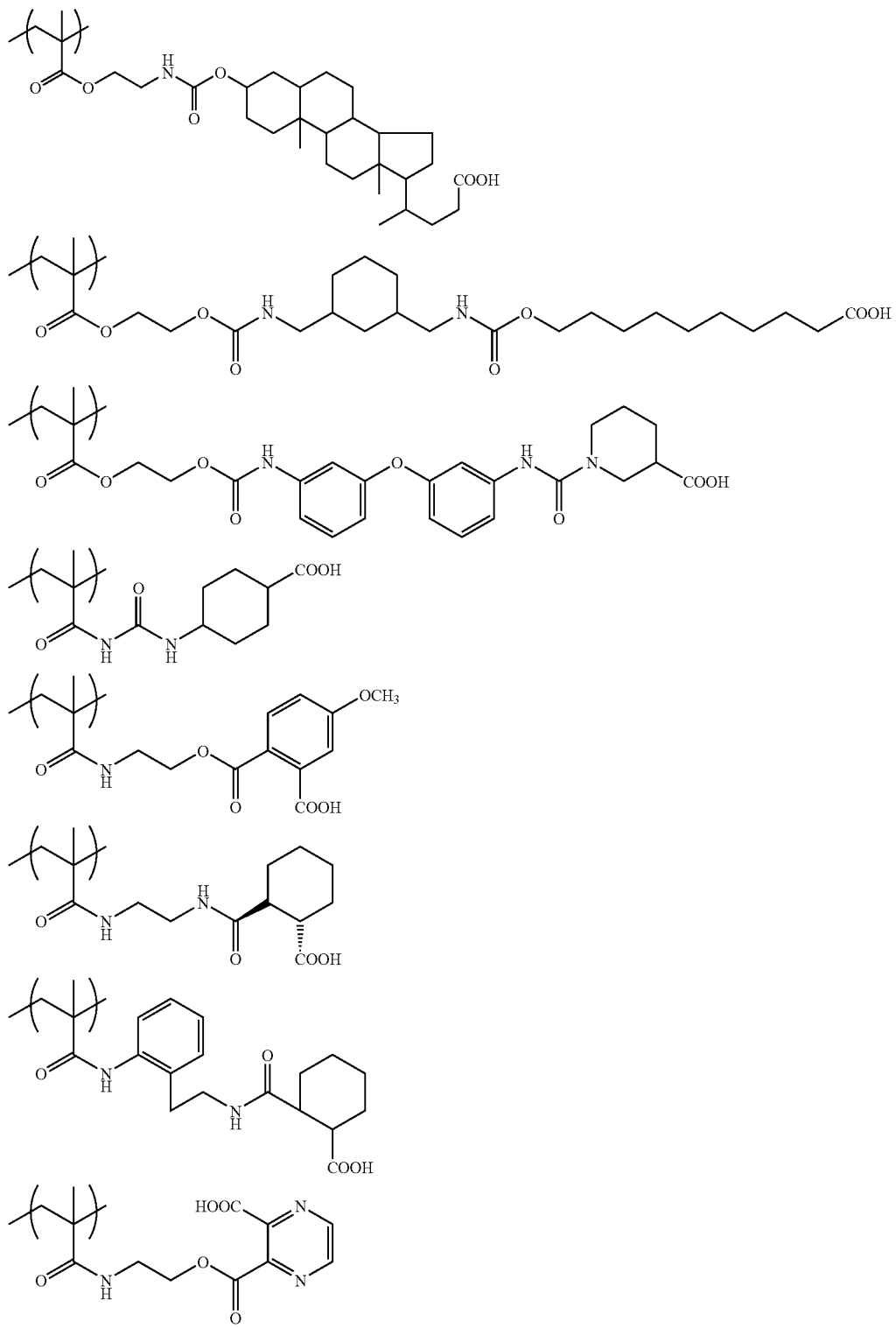

One or two or more kinds of repeating unit represented by the formula (I) may be contained in the binder polymer. The specific binder polymer in the invention may be a polymer composed exclusively of the repeating unit represented by the formula (I), but is usually used as a copolymer containing other copolymerizable components. The total content of the repeating unit represented by the formula (I) in the copolymer is determined suitably depending on the structure of the copolymer, design of the photosensitive layer, etc., but usually the repeating unit is contained in an amount of 1 to 99 mol %, more preferably 5 to 40 mol %, and still more preferably 5 to 20 mol %, based on the total molar amount of the polymer components.

When a copolymer is used as the binder polymer, copolymerizable components known in the art can be used without limitation insofar as they are radical-polymerizable monomers. Specifically, examples of the components include monomers described in Polymer Data Handbook—Fundamental Version—(in Japanese) compiled by the Society of Polymer Science, Japan and published by Baifukan, 1986. Such copolymerizable components can be used alone or in combination thereof.

The molecular weight of the specific binder polymer in the invention is suitably determined from the viewpoint of image-forming property and printing press life. Usually, when the molecular weight is increased, printing press life is improved but image-forming property tends to be deteriorated. On the other hand, when the molecular weight is decreased, image-forming property is improved, while printing press life is deteriorated. The molecular weight is preferably in a range of 2,000 to 1,000,000, more preferably 5,000 to 500,000, and still more preferably 10,000 to 200,000.

As the binder polymer used in the photosensitive layer in the planographic printing plate precursor of the invention, the specific binder polymer may be used alone, or may be used in combination with one or more other binder polymers used frequently in this field. When the specific binder polymer is used, binder polymers used in combination therewith are used in a range of 1 to 60% by mass, preferably 1 to 40% by mass, and more preferably 1 to 20% by mass, based on the total weight of the binder polymer components.

The total amount of the specific binder polymer and binder polymers which can be used in combination therewith in the photosensitive layer can be suitably determined, and is usually 10 to 90% by mass, preferably 20 to 80% by mass, and more preferably 30 to 70% by mass, based on the total weight of nonvolatile components in the photosensitive layer.

The acid value (meg/g) of the binder polymer is preferably in a range of 2.00 to 3.60.

In addition to the fundamental components described above, other components suitable for use, the process etc. can be added to a heat-polymerizable negative type photosensitive layer preferred as the photosensitive layer in the planographic printing plate precursor of the invention.

(Carboxylic Acid Compound)

From the viewpoint of shelf stability, a carboxylic acid compound is preferably used in the photosensitive layer in the invention.

The carboxylic acid compound which can be used in the invention is a compound having a weight-average molecular weight of 3000 or less and at least one carboxylic group. The compound can be selected from compounds such as an optionally substituted aliphatic carboxylic acid, an optionally substituted aromatic carboxylic acid, and a carboxylic acid linked directly to an optionally substituted heterocyclic ring. Preferably used among these compounds are a phthalic acid derivative, a trimellitic acid derivative, a pyromellitic acid derivative, a succinic acid derivative, a benzoic acid derivative, a glycine derivative and the like.

The weight-average molecular weight of the carboxylic acid compound should be 3000 or less, and is preferably in a range of 60 to 2000, and more preferably in a range of 100 to 1500. A molecular weight of higher than 3000 is not preferred because the carboxylic acid compound is easily adsorbed onto a substrate to generate smuts easily.

Hereinafter, examples (Compound Nos. 1 to 20) of the carboxylic acid compound used preferably in the invention are mentioned, but the invention is not limited thereto.

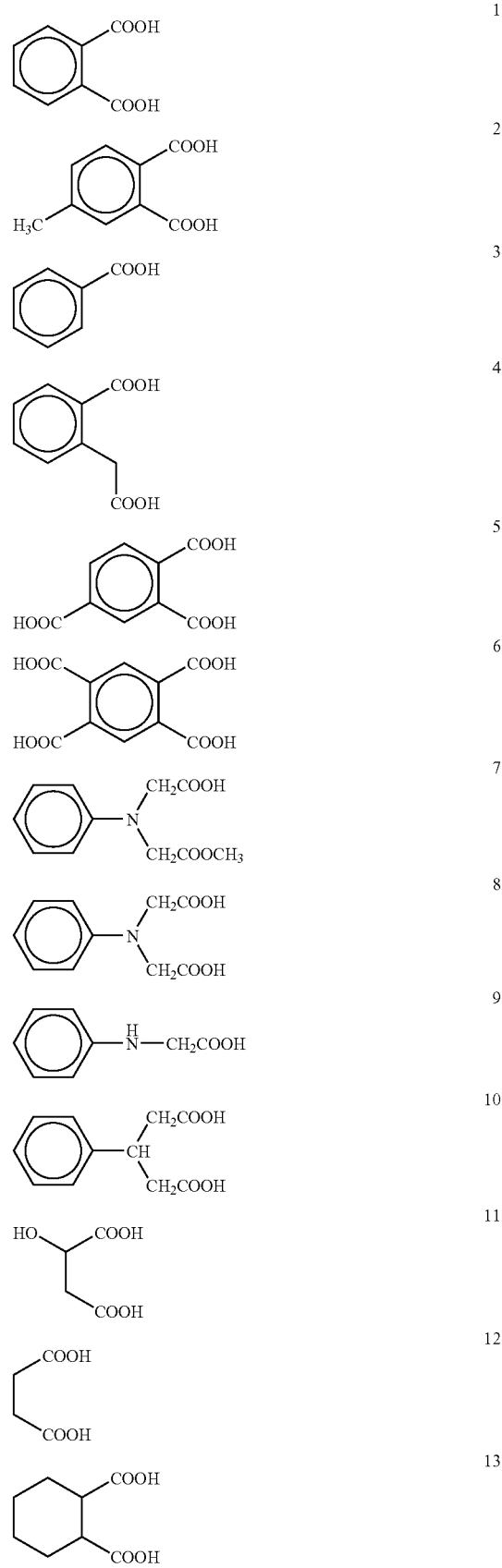

-continued

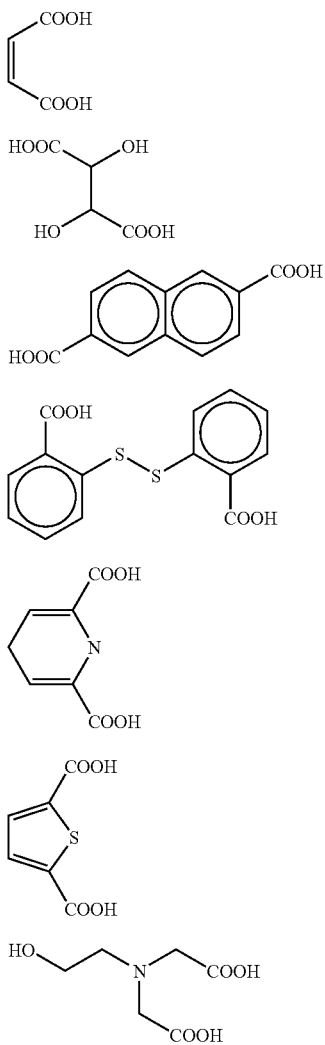

The carboxylic acid compounds may be used alone or as a mixture of two or more thereof. The content of the carboxylic acid compound in the photosensitive composition is preferably in a range of 0.5 to 30% by mass, and more preferably 2 to 20% by mass, based on the total solids content.

Other optional additives include various additives such as dyes, plasticizers and polymerization inhibitors. Hereinafter, preferred examples of the additives which can be added as needed are mentioned.

(Polymerization Inhibitor)

A small amount of a heat-polymerization inhibitor is added desirably to the photosensitive layer in the planographic printing plate precursor of the invention in order to inhibit undesired heat polymerization of the polymerizable compound having an ethylenically unsaturated double bond during the production or storage of the negative type photosensitive composition. Preferred examples of the heat-polymerization inhibitor include hydroquinone, p-methoxyphenol, di-t-butyl-p-cresol, pyrogallol, t-butyl catechol, benzoquinone, 4,4'-thiobis(3-methyl-6-t-butyl phenol), 2,2'-methylene bis(4-methyl-6-t-butyl phenol), N-nitrosophenyl hydroxylamine primary cerium salts etc. The amount of the heat-polymerization inhibitor added is preferably about 0.01 to about 5% by mass relative to the weight of nonvolatile components in the entire composition. To prevent the inhibition of polymerization by oxygen, a higher fatty acid derivative such as behenic acid or behenic amide may be added as needed so that it is allowed to be locally present on the surface of the photosensitive layer in the drying step after application. The amount of the higher fatty acid derivative added is preferably about 0.5 to about 10% by mass relative to nonvolatile components in the entire composition.

(Coloring Agent)

Dyes or pigments may be added to the photosensitive layer in the planographic printing plate precursor of the invention for the purpose of coloring the photosensitive layer. The plate-checking property, that is, the visibility of the printing plate after plate-making and the applicability for image densitometer can thereby be improved. As the coloring agent, many dyes can cause reduction in the sensitivity of the photopolymerizable photosensitive layer, and thus pigments are particularly preferably used as the coloring agent. Examples of the coloring agent include pigments such as phthalocyanine type pigments, azo type pigments, carbon black and titanium oxide, and dyes such as ethyl violet, crystal violet, azo type dyes, anthraquinone type dyes and cyanine type dyes. The amount of the dyes and pigments added is preferably about 0.5 to about 5% by mass of nonvolatile components in the entire composition.

(Other Additives)

Known additives such as inorganic fillers for improving the physical properties of the cured layer, other plasticizers and ink receptivity agent capable of improving the inking property on the surface of the photosensitive layer may also be added.

The plasticizers include e.g. dioctyl phthalate, didodecyl phthalate, triethylene glycol dicaprylate, dimethyl glycol phthalate, tricresyl phosphate, dioctyl adipate, dibutyl sebacate, triacetyl glycerin etc., and these can be generally added in an amount of 10% by mass or less relative to the total weight of the binder polymer and the addition-polymerizable compound. UV initiators and heat-crosslinking agents for enhancing the effect of heating and irradiation after development can also be added for the purpose of improving the film strength (printing press life) described later.

When the photosensitive layer is arranged by coating, the photopolymerizable composition of the photosensitive layer components is dissolved in various organic solvents and applied onto the intermediate layer. The solvent used in this case includes acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxy propanol, methoxy methoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxy propyl acetate, N,N-dimethyl formamide, dimethyl sulfoxide, γ-butyrolactone, methyl lactate and ethyl lactate. These solvents can be used singly or in combination thereof. The solids content of the coating solution is suitably 2 to 50% by mass.

The coating amount of the photosensitive layer mainly affects the sensitivity and developing property of the photosensitive layer and the strength and printing press life of the layer exposed to light, and is desirably selected depending on the use. When the coating amount is too low, the printing press life is not sufficient. A too high coating amount is not preferred because sensitivity is lowered, exposure requires a long time, and a longer time is necessary for development. The coating amount on the planographic printing plate precursor for scanning exposure as the major object of the invention is preferably in a range of about 0.1 to about 10 g/m², and more preferably 0.5 to 5 g/m², on a dry weight basis.

With respect to the physical properties of the photosensitive layer in the invention, the developing rate of the unexposed portion with an alkaline developing solution having a pH of 10 to 13.5 is preferably 80 nm/sec or more, and the permeation rate of the alkaline developing solution to an exposed portion of a photosensitive layer is preferably 100 nF/sec or less. The methods of measuring "the developing rate with an alkaline developing solution" and "the permeation rate of an alkaline developing solution" are described below.

[Measurement of Developing Rate with Alkaline Developing Solution]

The developing rate of the photosensitive layer with the alkaline developing solution is a value obtained by dividing the thickness (nm) of the photosensitive layer by time (sec) required for the developing process.

The developing rate in the invention was measured by a DRM interference measuring device for measuring the dissolution behavior of the photosensitive layer. FIG. 1 is an illustration of the DRM interference measuring device. A photosensitizer 100 comprising an unexposed photosensitive layer 102 provided on an aluminum substrate 104 was dipped in a predetermined alkaline developing solution 106 (30° C.) in a range of pH 10 to 13.5, and the dissolution behavior of the photosensitive layer was examined with the DRM interference measuring device. In the invention, the change in the layer thickness was detected by interference with light of 640 nm. When the development behavior is non-swelling development starting from the surface of the photosensitive layer, the layer thickness is gradually decreased in proportion to the development time to give interference waves depending on the thickness. In the case of swelling dissolution (dissolution to remove the layer), the layer thickness is changed depending on the permeation of the developing solution, thus failing to give beautiful interference waves.

The development completion time (sec) in which the photosensitive layer is completely removed (i.e., the thickness of the layer becomes 0) under these conditions is then determined. Based on this development completion time (sec) and the thickness (nm) of the photosensitive layer, the developing rate can be determined according to the equation below. A higher developing rate indicates easier removal of the layer with the developing solution, that is, better developing property.

Developing rate (of an unexposed portion)(nm/sec)=
[(thickness of photosensitive layer (nm)/development completion time (sec)]

[Measurement of Permeation Rate of Alkaline Developing Solution to Exposed Portion]

The permeation rate of the alkaline developing solution to an exposed portion indicates the rate of change in the electrostatic capacity (F) of the photosensitive layer formed on a conductive substrate upon being dipped in a developing solution.

Figure 2:
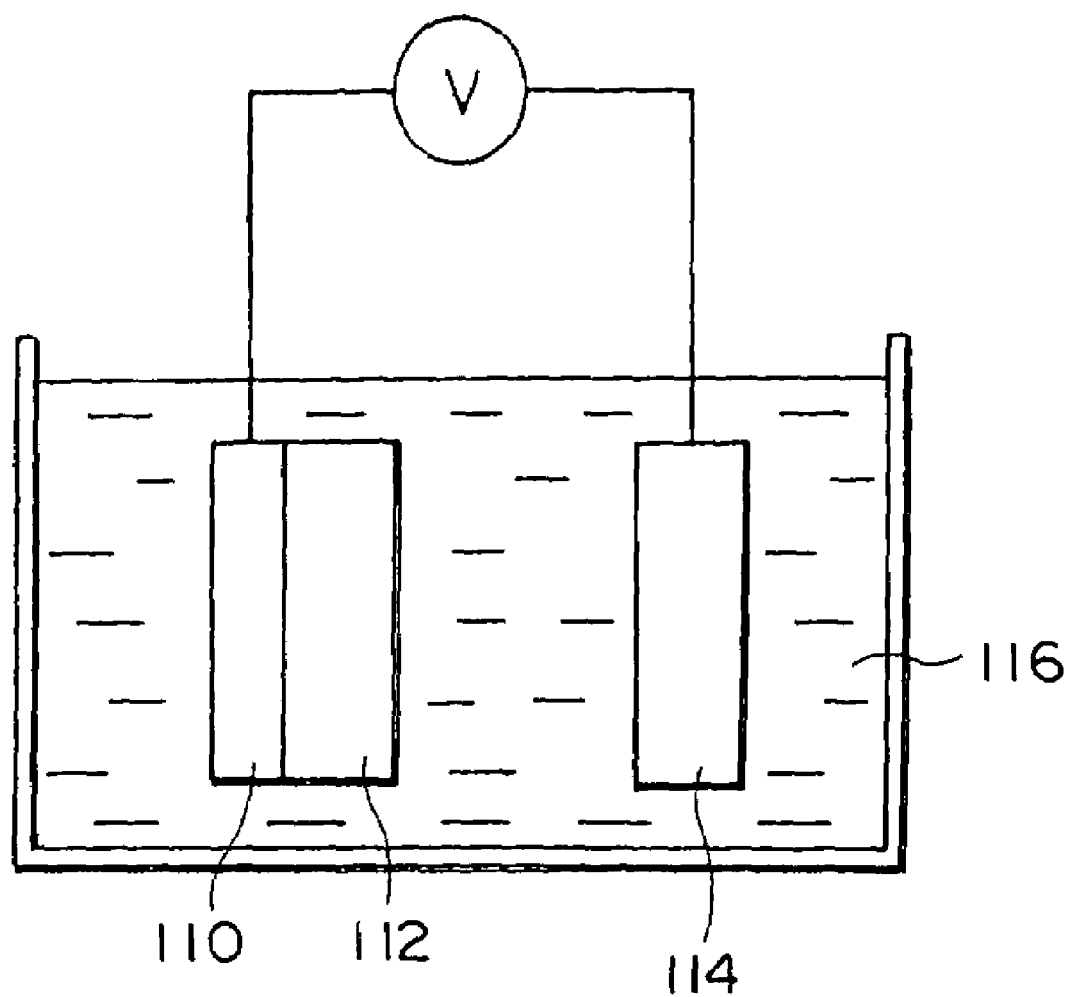
FIG. 2 is a schematic diagram that explains one example of a method of measuring electrostatic capacity. The method is used for evaluating the permeability of a developing solution to a photosensitive layer.

The method of measuring electrostatic capacity that serves as a scale for permeability in the invention is explained with reference to FIG. 2. Two electrodes are immersed in an alkaline developing solution 116 (28° C.) having a predetermined pH value in a range of pH 10 to 13.5. One electrode is an aluminum substrate 110 on which a photosensitive layer 112 that has been cured by being exposed with a predetermined dose of exposure is disposed. The aluminum substrate 110 is connected to a wire. The other electrode is a normal electrode 114. A voltage is applied to the electrodes, and as the immersion time progresses after the application of the voltage, the developing solution 116 permeates the interface between the substrate 110 and the photosensitive layer 112, resulting in a change in the electrostatic capacity.

The permeation rate can be obtained according to the following equation based on the time (sec) required for the electrostatic capacity to become constant, and the saturated value of the electrostatic capacity (nF) of the photosensitive layer. A smaller permeation rate indicates lower permeability of the developing solution.

Permeation rate of developing solution (in an exposed portion) (nF/sec)=[Saturated value of electrostatic capacity of the photosensitive layer (nF)/Time required for electrostatic capacity to become constant (sec)]

With respect to the physical properties of the photosensitive layer in the planographic printing plate precursor of the invention, the developing rate of an unexposed portion with an alkaline developing solution having a pH of 10 to 13.5 is preferably 80 nm/sec or more, and the permeation rate of the alkaline developing solution to an exposed portion of the photosensitive layer is preferably 100 nF/sec or less, as determined by the method described above. The developing rate of an unexposed portion with an alkaline developing solution having a pH of 10 to 13.5 is more preferably 90 to 200 nm/sec, and the permeation rate of the alkaline developing solution into the photosensitive layer is more preferably 80 nF/sec or less. The upper limit of the developing rate and the lower limit of the permeation rate are not particularly limited. However, in view of the balance between the two rates, it is preferred that the developing rate of an unexposed portion is in a range of 90 to 200 nm/sec, and that the permeation rate of the alkaline developing solution in the photosensitive layer is preferably 80 nF/sec or less.

By using the specific binder polymer in the invention, the developing rate of the photosensitive layer and the permeation rate of the developing solution can be set in the preferred ranges described above.

[Protective Layer]

In the invention, a protective layer is arranged on the photosensitive layer. The protective layer in the invention should contain an UV absorber.

The UV absorber used in the invention preferably has a maximum absorption in a UV region, and more preferably at a wavelength in a range of 300 to 420 nm. Preferably, it does not substantially inhibit the transmission of light used for exposure. In this respect, a compound that does not absorb at a wavelength of 840 to 1200 nm is preferred. Preferred UV absorbers in the invention are dyes having a maximum absorption at a wavelength in a range of 350 to 400 nm. Examples thereof include UV absorbing dyes described in JP-A Nos. 62-210458, 63-104046, 63-103235, 63-208846, 1-061745, 63-306436 and 63-314535.

Specific examples of the compound that has a maximum absorption at a wavelength in a range of 300 to 400 nm and can be used in the invention include a benzotriazole compound substituted with an aryl group, a 4-thiazolidone compound, a benzophenone compound, a cinnamate compound, a butadiene compound, a benzoxazole compound and a UV absorbing polymer.

The UV absorbing dyes used particularly preferably as the UV absorber include compounds having a maximum absorption at a wavelength in a range of 300 to 420 nm represented by the following formula [1-a], [1-b], [1-c] or [1-d].

Formula [1-a]

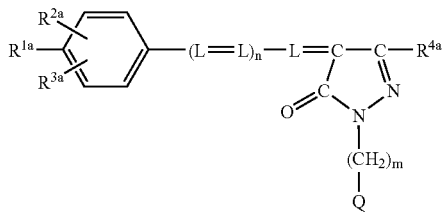

In formula [1-a], $R^{1a}$ is an atomic group represented by —OX or —N(X)(Y) wherein X and Y each represent a hydrogen atom, alkyl group, cyanoalkyl group, carboxyalkyl group, sulfoalkyl group, hydroxyalkyl group, halogenated alkyl group or optionally substituted alkyl group, or a sodium or potassium salt thereof, $R^{2a}$ and $R^{3a}$ each represent a hydrogen atom, halogen atom, alkyl group, hydroxy group, alkoxy group, alkylthio group, or the same group the above-mentioned —OX group, Q represents a phenyl group, sulfoalkyl group, sulfoalkoxyalkyl group or sulfoalkylthioalkyl group, each of which is substituted with at least one halogen atom, carboxy group, sulfo group, sulfoalkyl group, or sodium or potassium salt thereof, and L represents an optionally substituted methine group. $R^{4a}$ represents an alkyl group, carboxy group, alkyloxycarbonyl group, or acyl-substituted or unsubstituted amino group. m is 1 or 2, and n is 0 or 1.

Formula [1-b]

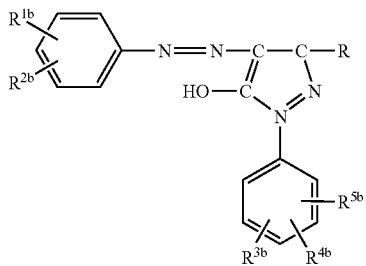

In formula [1-b], $R^{1b}$, $R^{2b}$, $R^{3b}$, $R^{4b}$ and $R^{5b}$ each represent a hydrogen atom, halogen atom, alkyl group, hydroxyl group, alkoxy group, amino group, acylamino group, carboxyl group or sulfone group, or a sodium or potassium salt thereof, and R represents an alkyl group or carboxyl group.

Formula [1-c]

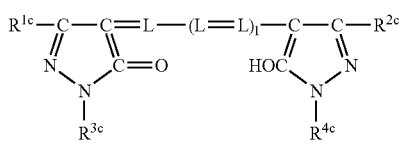

In formula [1-c], $R^{1c}$ and $R^{2c}$ each represent an alkyl group, substituted alkyl group, aryl group, alkoxycarbonyl group or carboxyl group, $R^{3c}$ and $R^{4c}$ each represent a sulfonic acid group, an alkyl or sulfonic acid group substituted with a carboxyl group, an aryl group substituted with a carboxyl group or sulfonic acid group, or a sodium or potassium salt thereof, L represents a substituted or unsubstituted methine chain. M represents sodium, potassium or a hydrogen atom, and l is 0 or 1.

Formula [1-d]

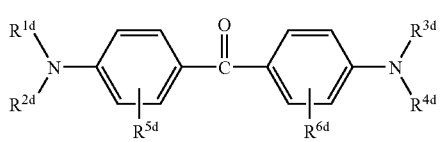

In formula [1-d], $R^{1d}$, $R^{2d}$, $R^{3d}$ and $R^{4d}$ each represent an alkyl group, hydroxyalkyl group, cyano group, alkylcyano group, alkoxy group or sulfoalkyl group. $R^{5d}$ and $R^{6d}$ each represent a sulfonic acid group and alkylsulfonic acid group.

Specific examples (Compounds 1-1 to 1-27) of dyes used preferably in the invention are shown below, but the invention is not limited thereto.

1-1

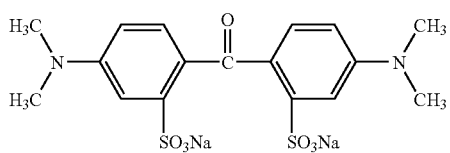

1-2

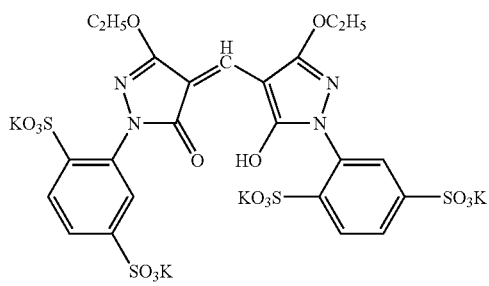

1-3

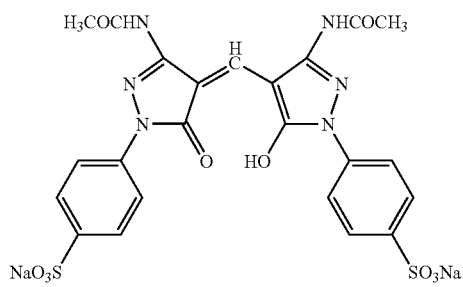

1-4

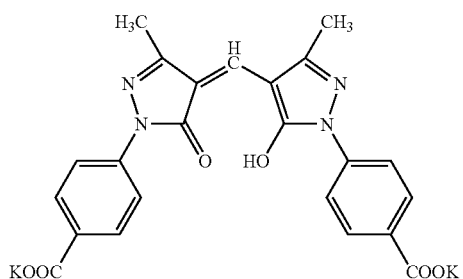

1-5

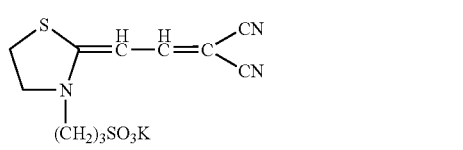

-continued
1-6
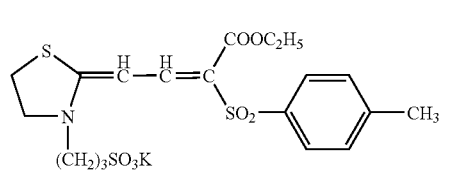
1-7
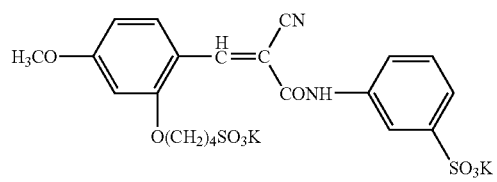
1-8
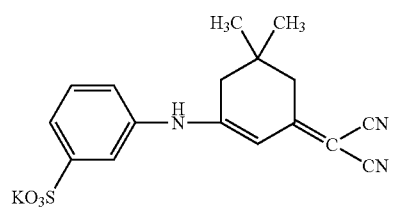
1-9
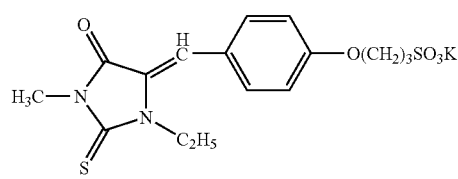
1-10
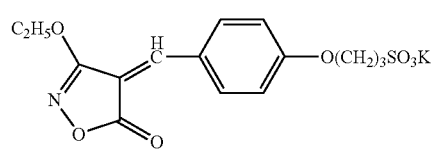
1-11
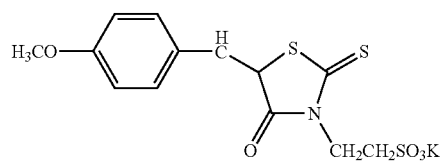
1-12
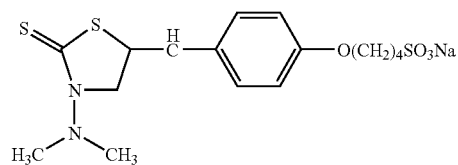
1-13
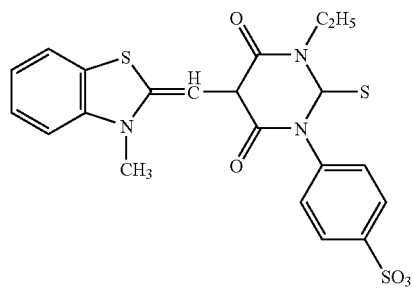
-continued
1-14
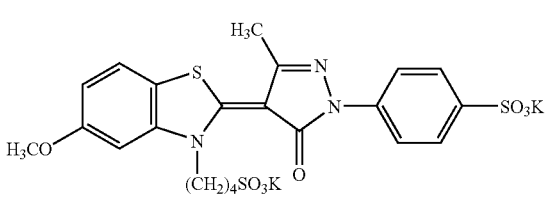
1-15
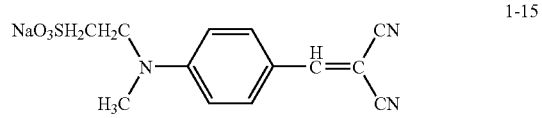
1-16
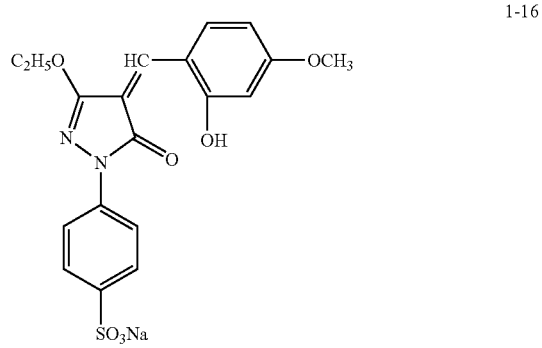
1-17
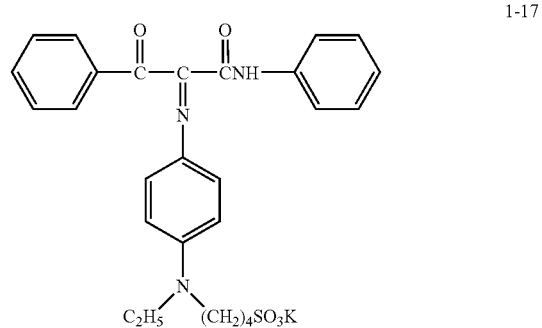
1-18
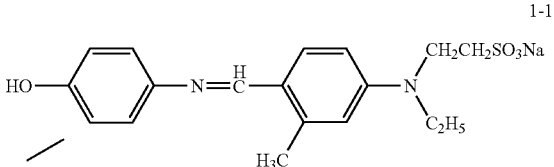
1-19
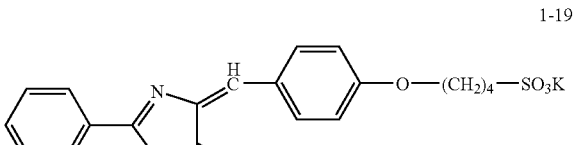
1-20
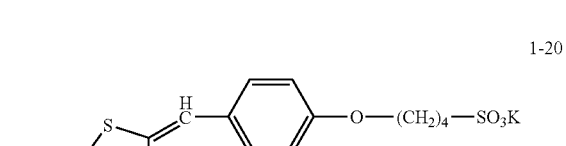

-continued

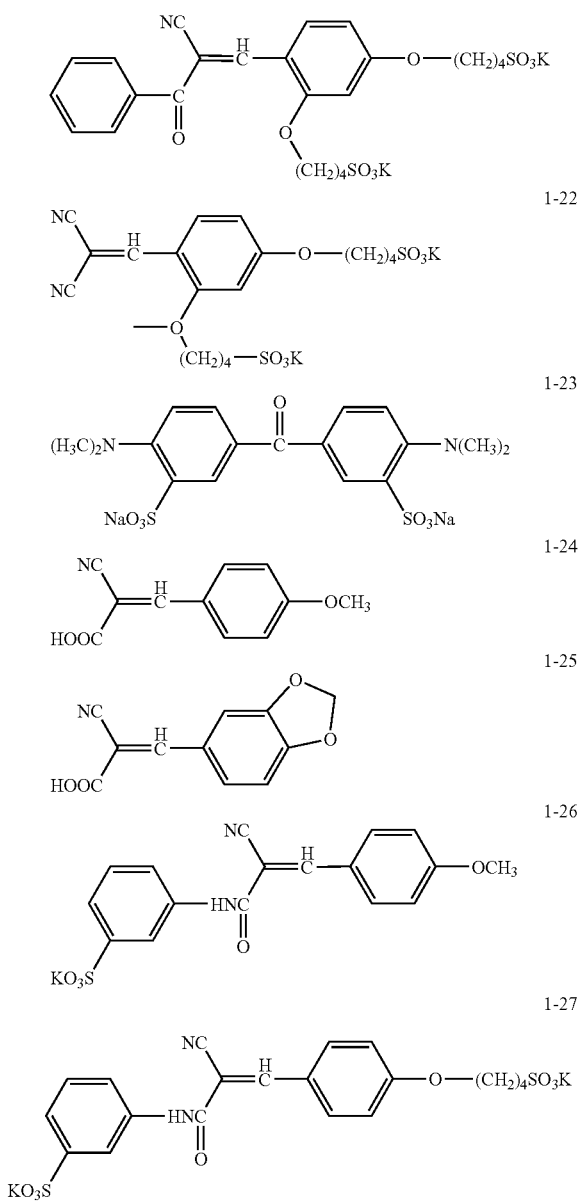

These dyes are added to the protective layer, and the protective layer is water-soluble, and thus the UV absorbers used are also preferably water-soluble compounds. Because the photosensitive layer is water-insoluble, the adjacent photosensitive layer will not be contaminated with the UV absorber, thus eliminating the undesired influence of the UV absorber on the photosensitive layer.

The dyes are contained preferably in an amount of about 5 to 40% by mass in terms of solids content in the protective layer coating solution. A content outside of this range is not preferred because when the content is too low, the effect of the invention is hardly achieved, while when the content is too high, the physical strength of the protective layer tends to be lowered.

The protective layer is arranged usually for physically protecting the surface of the photosensitive layer by preventing occurrence of mars etc. on the surface of the photosensitive layer. The protective layer when applied, as in the invention, to the photosensitive layer having a radical-polymerizable image forming mechanism acts as an oxygen-impermeable layer and serves as an ablation-preventing layer when exposed to light with a high-intensity infrared laser. In the invention, the protective layer is endowed with an ability to absorb UV rays, thus significantly improving shelf stability and handlability under white light.

In addition, the desired characteristics of the protective layer are excellent adhesion to the photosensitive layer and high removability in the development step after exposure to light. The protective layer has been devised and described in detail in U.S. Pat. No. 3,458,311 and JP-A No. 55-49729.

The materials usable in the protective layer are preferably water-soluble polymers relatively excellent in crystallinity, and examples thereof include water-soluble polymers such as polyvinyl alcohol, vinyl alcohol/vinyl phthalate copolymers, vinyl acetate/vinyl alcohol/vinyl phthalate copolymers, vinyl acetate/crotonic acid copolymers, polyvinyl pyrrolidone, acidic celluloses, gelatin, gum arabic, polyacrylic acid and polyacrylamide, and these can be used alone or as a mixture thereof. Among these compounds, polyvinyl alcohol can be used as a major component to give the best result to basic characteristics such as oxygen impermeability and removability by development.

The polyvinyl alcohol used in the protective layer may be partially replaced by ester, ether and acetal insofar as it has unsubstituted vinyl alcohol units for giving necessary oxygen impermeability and water solubility. Similarly, it may partially have other copolymerizable components.

Examples of the polyvinyl alcohol include those hydrolyzed at a degree of 71 to 100%, having 300 to 2400 repeating units. Specifically, mention is PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, L-8 etc. which are available from Kuraray Co., Ltd.

The components (PVA selected and additives used) in the protective layer, the coating amount, etc. are selected in consideration of fogging, adhesiveness and anti-scratch property in addition to oxygen impermeability and removability by development. In general, as the degree of hydrolysis of PVA used becomes higher (or the content of unsubstituted vinyl alcohol units in the protective layer becomes higher) or as the thickness of the layer is increased, there are brought about higher oxygen impermeability, which are advantageous to sensitivity. However, if the oxygen impermeability is too much increased, there may arise problems of undesired polymerization reaction during production or storage, and unnecessary fogging and dot gain upon exposure of an image to light.

Accordingly, the oxygen permeability at 25° C. at 1 atmospheric pressure is preferably $0.2 \leq A \leq 20$ (cc/m$^2$·day).

The molecular weight of the (co)polymer such as polyvinyl alcohol (PVA) is in a range of 2000 to 10,000,000, preferably 20,000 to 3,000,000.

As other components in the protective layer, glycerine, dipropylene glycol etc. can be added in an amount of a few % by mass based on the polymer, to confer flexibility, and anionic surfactants such as sodium alkylbenzenesulfonate and sodium alkylsulfonate, amphoteric surfactants such as alkylaminocarboxylates and alkylaminodicarboxylates and nonionic surfactants such as polyoxyethylene alkyl phenyl ether can be added in an amount of a few % by mass based on the (co)polymer.

The thickness of the protective layer is suitably 0.5 to 5 μm, particularly preferably 0.5 to 2 μm.

In addition, the adhesion of the protective layer to an image region and the anti-scratch property thereof are very important for handlability of the plate. That is, if a hydrophilic layer consisting of a water-soluble polymer is laminated on a lipophilic polymer layer, layer separation occurs easily due to insufficient adhesive force, and the released portion causes deficiency such as insufficient layer curing attributable to polymerization inhibition with oxygen. Against this problem, various proposals for improving the adhesiveness between the two layers have been made. For example, U.S. patent application Ser. Nos. 292,501 and 44,563 describe that an acrylic emulsion, a water-insoluble vinyl pyrrolidone-vinyl acetate copolymer etc. are mixed in an amount of 20 to 60% by mass in a hydrophilic polymer based on polyvinyl alcohol and then laminated on a polymer layer thereby achieving satisfactory adhesiveness. Any of these known techniques can be applied to the protective layer in the invention. The method of applying the protective layer is described in detail in e.g. U.S. Pat. No. 3,458,311 and JP-A No. 55-49729.

[Substrate]

As the substrate used in the planographic printing plate precursor of the invention, a known hydrophilic substrate used in the planographic printing plate precursor can be used without limitation.

The substrate used is preferably a dimensionally stable plate, and examples thereof include a paper, a paper with plastics (e.g., polyethylene, polypropylene, polystyrene etc.) laminated thereon, a metal plate (e.g., aluminum, zinc, copper etc.) and plastic film (e.g., cellulose diacetate, cellulose triacetate, cellulose propionate, cellulose butyrate, cellulose butyrate acetate, cellulose nitrate, polyethylene terephthalate, polyethylene, polystyrene, polypropylene, polycarbonate, polyvinyl acetal etc.), paper or plastic film having the above metal laminated or vapor-deposited thereon and their surfaces may be subjected to suitable known physical or chemical treatment for the purpose of conferring hydrophilicity or improving strength as needed.

Particularly, the substrate is preferably a paper, a polyester film or an aluminum plate, among which the aluminum plate is excellent in dimensional stability, is relatively inexpensive, can provide a surface excellent in hydrophilicity and strength by surface treatment conducted as needed, and is thus particularly preferred. A composite sheet having an aluminum sheet bonded to a polyethylene terephthalate film, as described in JP-B No. 48-18327, is also preferred.

The aluminum plate is a metal plate based on dimensionally stable aluminum, and is selected not only from a pure aluminum plate but also from an alloy plate based on aluminum containing a very small amount of different elements and a plastic film or paper having aluminum (alloy) laminated or vapor-deposited thereon. In the following description, the substrates made of aluminum or aluminum alloys indicated above are referred to collectively as the aluminum substrate. The different elements contained in the aluminum alloy include silicon, iron, manganese, copper, magnesium, chromium, zinc, bismuth, nickel, titanium etc. The content of the different elements in the alloy is up to 10% by mass. Particularly preferred aluminum in the invention is a pure aluminum plate, but because production of absolutely pure aluminum is difficult in refining techniques, aluminum may contain a very small amount of different elements. The composition of the aluminum plate thus used in the invention is not limited, and any aluminum plates made of a known and conventionally used aluminum material such as JIS A 1050, JIS A 1100, JIS A 3103 and JIS A 3005 can be used as needed.

The thickness of the aluminum substrate used in the invention is about 0.1 to 0.6 mm. This thickness can be suitably changed depending on the size of a printing machine, the size of a printing plate, and user's hope. The aluminum substrate may or may not be subjected to substrate surface treatment described later.

(Surface Roughening Treatment)

The surface roughening treatment includes mechanical roughening, chemical etching and electrolytic grain as disclosed in JP-A No. 56-28893. Use can also be made of an electrochemical surface roughening method for electrochemical surface roughening in a hydrochloric acid or nitric acid electrolyte and mechanical surface roughening methods such as a wire blush grain method of scratching an aluminum surface with a metallic wire, a pole grain method of graining an aluminum surface with abrasive grains ball and an abrasive and a brush grain method of surface roughening with a nylon brush and an abrasive, and these surface roughening methods can be used singly or in combination thereof. Among these methods, the electrochemical method of chemical surface roughening in a hydrochloric acid or nitric acid electrolyte is particularly useful in surface roughening, and the suitable anodizing electricity is in a range of 50 to 400 C/dm². Specifically, alternating current and/or direct current electrolysis is conducted preferably at a temperature of 20 to 80° C., for 1 second to 30 minutes and at a current density of 100 to 400 C/dm² in an electrolyte containing 0.1 to 50% hydrochloric acid or nitric acid.

The aluminum substrate thus surface-roughened may be etched chemically with an acid or an alkali. Preferred examples of the etching agent used include sodium hydroxide, sodium carbonate, sodium aluminate, sodium metasilicate, sodium phosphate, potassium hydroxide, lithium hydroxide etc., and the concentration and temperature are preferably in a range of 1 to 50% and 20 to 100° C., respectively. After etching, washing with an acid is carried out to remove smuts remaining on the surface. The acid used includes nitric acid, sulfuric acid, phosphoric acid, chromic acid, fluoric acid and borofluoric acid. After electrochemical roughening treatment, the method of removing smuts is preferably a method of contacting with 15 to 65% by mass at a temperature of 50 to 90° C. as described in JP-A No. 53-12739 and a method of alkali etching as described in JP-B No. 48-28123. After the treatment described above, the method and conditions are not limited insofar as the central line average roughness Ra of the treated surface is 0.2 to 0.5 μm.

(Anodizing Treatment)

The thus treated aluminum substrate having an oxide layer formed thereon is then subjected to anodizing treatment.

In the anodizing treatment, an aqueous solution of sulfuric acid, phosphoric acid, oxalic acid and/or boric acid-sodium borate can be used singly or in combination thereof as the major component in an electrolytic bath. In this case, the electrolyte may of course contain at least components usually contained in an Al alloy plate, electrode, tap water and underground water. Second and third components may also be contained. The second and third components referred to therein include, for example, metal ions such as Na, K, Mg, Li, Ca, Ti, Al, V, Cr, Mn, Fe, Co, Ni, Cu and Zn, cations such as ammonium ions, and anions such as nitrate ion, carbonate ion, chlorine ion, phosphate ion, fluorine ion, sulfite ion, titanate ion, silicate ion and borate ion, and these may be contained at a concentration of 0 to 10000 ppm. Although the conditions for anodizing treatment are not particularly limited, the plate is treated preferably with 30 to 500 g/L solution at a temperature of 10 to 70° C. by direct current or alternating current electrolyte at a current density of 0.1 to 40 A/m². The thickness of the anodized layer formed is in a range of 0.5 to 1.5 μm, and preferably 0.5 to 1.0 μm. The treatment conditions should be selected such that the pore diameter of micropores present in the anodized layer formed on the substrate by the treatment described above is 5 to 10 nm and the pore density is $8 \times 10^{15}$ to $2 \times 10^{16}$ pores/m².

For treatment for conferring hydrophilicity on the surface of the substrate, various known methods can be used. The treatment is particularly preferably hydrophilicity-conferring treatment with silicate or polyvinylphosphonic acid. The layer is formed from an Si or P element in an amount of 2 to 40 mg/m², preferably 4 to 30 mg/m². The coating amount can be measured by fluorescence X ray analysis.

In the hydrophilicity-conferring treatment, the aluminum substrate having an anodized layer formed thereon is dipped in an aqueous solution having a pH of 10 to 13 (determined at 25° C.) containing an alkali metal silicate or polyvinylphosphonic acid in an amount of 1 to 30% by mass, and more preferably 2 to 15% by mass, for example at 15 to 80° C. for 0.5 to 120 seconds.

As the alkali metal silicate used in the treatment for conferring hydrophilicity, sodium silicate, potassium silicate, lithium silicate etc. are used. The hydroxide used for raising the pH value of the aqueous alkali metal silicate solution includes sodium hydroxide, potassium hydroxide, lithium hydroxide etc. Alkaline earth metal salts or the group IVB metal salts may be incorporated into the treating solution described above. The alkaline earth metal salts include nitrates such as calcium nitrate, strontium nitrate, magnesium nitrate and barium nitrate, and water-soluble salts such as nitrate, hydrochloride, phosphate, acetate, oxalate and borate. The group IVB metal salts include titanium tetrachloride, titanium trichloride, titanium potassium fluoride, titanium potassium oxalate, titanium sulfate, titanium tetraiodide, zirconium chloride oxide, zirconium dioxide, zirconium oxychloride, zirconium tetrachloride etc.

The alkaline earth metal salts or the group IVB metal salts can be used singly or in combination thereof. The amount of these metal salts is preferably in a range of 0.01 to 10% by mass, and more preferably 0.05 to 5.0% by mass. Electrodeposition with silicate as described in U.S. Pat. No. 3,658,662 is also effective. A substrate subjected to electrolytic grain as disclosed in JP-B No. 46-27481, JP-A Nos. 52-58602 and 52-30503, and surface treatment comprising the anodizing treatment in combination with the hydrophilicity-conferring treatment, are also useful.

[Intermediate Layer]

For the purpose of preventing staining and improving adhesiveness between the photosensitive layer and the substrate, an intermediate layer may be arranged in the planographic printing plate precursor in the invention. Examples of such intermediate layers include those described in JP-B No. 50-7481, JP-A Nos. 54-72104, 59-101651, 60-149491, 60-232998, 3-56177, 4-282637, 5-16558, 5-246171, 7-159983, 7-314937, 8-202025, 8-320551, 9-34104, 9-236911, 9-269593, 10-69092, 10-115931, 10-161317, 10-260536, 10-282682, 11-84674, 10-069092, 10-115931, 11-038635, 11-038629, 10-282645, 10-301262, 11-024277, 11-109641, 10-319600, 11-084674, 11-327152,2000-010292, 2000-235254, 2000-352824 and 2001-209170.

Now, the method of producing the planographic printing plate precursor according to the invention is described. The planographic printing plate precursor of the invention is subjected to imagewise exposure to light having a wavelength of 750 to 1400 nm and then subjected if desired to a pre-water-washing step of removing the protective layer, a heating treatment step for promotion of image effect, and a development step.

This plate-making method can be applied suitably to a planographic printing plate precursor provided with a polymerizable negative type photosensitive layer containing an IR absorber, a polymerization initiator and a polymerizable compound and exhibiting reduction in solubility in an alkaline developing solution upon being exposed to light having a wavelength of 750 to 1400 nm. Specifically, the polymerizable negative type photosensitive layer may be a photosensitive layer containing "the IR absorber, the polymerization initiator and the polymerizable compound" described in the constitution of the photosensitive layer in the planographic printing plate precursor of the invention, and as the binder polymer, a known one may or may not be contained therein. As a matter of course, this plate-making method can be suitably used to make the planographic printing plate precursor of the invention containing the specific binder polymer described above.

The photosensitive layer to which the method of producing the planographic printing plate precursor is applicable is preferably a layer wherein the developing rate at an unexposed portion with an alkaline developing solution having a pH of 10 to 13.5 is preferably 80 nm/sec or more, and the permeation rate of the alkaline developing solution into the photosensitive layer is preferably 100 nF/sec or less.

The developing rate at an unexposed portion in the photosensitive layer and the permeation rate of the alkaline developing solution into the photosensitive layer after curing can be controlled in a usual manner. Typical useful methods involve using the specific binder polymer, or adding a hydrophilic compound for improving the developing rate at an unexposed portion, or adding a hydrophobic compound for suppressing the permeation of the developing solution to the exposed portion.

First, the planographic printing plate precursor is subjected to imagewise exposure to light.

The light source used in the step of exposure is preferably an IR laser, and thermal recording with a UV lamp or a thermal head is also feasible.

The planographic printing plate precursor of the invention is preferably imagewise exposed to an infrared ray having a wavelength of 750 nm to 1400 nm emitted by a solid laser or a semiconductor laser. The output power of the laser is preferably 100 mW or more, and a multi-beam laser device is preferably used to reduce the exposure time. The exposure time per pixel is preferably within 20 μsec. The energy irradiated on the recording material is preferably 10 to 300 mJ/cm². When the energy of exposure is too low, the curing of the image-recording layer does not sufficiently proceed. When the energy for exposure is too high, the image-recording layer may be ablated with the laser to damage the image.

The exposure in the invention can be carried out by overlapping beams from a light source. By overlapping, the width of the sub-scanning pitch is made smaller than the diameter of the beam. For example, when the beam diameter is expressed in terms of full-width half-maximum (FWHM) of the beam intensity, overlapping can be quantitatively expressed in FWHM/sub-scanning pitch width (overlapping coefficient). In the invention, the overlapping coefficient is preferably 0.1 or more.

The scanning system of a light source in the exposure device used in the invention is not particularly limited, and a drum outer surface scanning method, a drum inner surface scanning method or a flatbed scanning method can be used. The channel of the light source may be a single channel or a multi-channel, but in the case of the drum outer surface scanning method, a multi-channel is preferably used.

In the invention, the planographic printing plate precursor subjected to imagewise exposure to light is subjected to heat treatment if desired and then to the development step. By omitting this heat treatment, it becomes possible to suppress non-uniformity of images attributable to this heat treatment.

The developing solution used in the developing treatment is particularly preferably an aqueous alkali solution having a pH of 14 or less, and more preferably an aqueous alkali solution having a pH of 8 to 12 containing an anionic surfactant. For example, mention is made of inorganic alkalis such as tribasic sodium phosphate, tribasic potassium phosphate, tribasic ammonium phosphate, dibasic sodium phosphate, dibasic potassium phosphate, dibasic ammonium phosphate, sodium carbonate, potassium carbonate, ammonium carbonate, sodium bicarbonate, potassium bicarbonate, ammonium bicarbonate, sodium borate, potassium borate, ammonium borate, sodium hydroxide, ammonium hydroxide, potassium hydroxide and lithium hydroxide. Further, use is made of organic alkalis such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethylene imine, ethylene diamine, and pyridine. These alkalis are used singly or in combination thereof.

In the development of the planographic printing plate precursor of the invention, an anionic surfactant is added in an amount of 1 to 20% by mass, preferably 3 to 10% by mass, to the developing solution. When the amount thereof is too low, the developing property is deteriorated, while when the amount is too high, such a problem may arise that the strength of an image, such as abrasion resistance, may be deteriorated. The anionic surfactant includes, for example, sodium salts of lauryl alcohol sulfate, ammonium salts of lauryl alcohol sulfate, sodium salts of octyl alcohol sulfate, alkyl aryl sulfonates such as sodium isopropyl naphthalene sulfonate, sodium isobutyl naphthalene sulfonate, sodium polyoxyethylene glycol mononaphthyl ether sulfate, sodium dodecyl benzene sulfonate and sodium m-nitrobenzene sulfonate, $C_{8-22}$ higher alcohol sulfates such as sodium secondary alkyl sulfate, fatty alcohol phosphates such as sodium cetyl alcohol phosphate, alkylamide sulfonates such as $C_{17}H_{33}CON(CH_3)CH_2CH_2SO_3Na$, and dibasic aliphatic sulfonates such as sodium dioctyl sulfosuccinate and sodium dihexyl sulfosuccinate.

If necessary, an organic solvent such as benzyl alcohol miscible with water may be added to the developing solution. The organic solvent is preferably the one having a water solubility of about 10% by mass or less, and more preferably 5% by mass or less. Examples of such organic solvents include 1-phenyl ethanol, 2-phenyl ethanol, 3-phenyl propanol, 1,4-phenyl butanol, 2,2-phenyl butanol, 1,2-phenoxy ethanol, 2-benzyloxy ethanol, o-methoxy benzyl alcohol, m-methoxy benzyl alcohol, p-methoxy benzyl alcohol, benzyl alcohol, cyclohexanol, 2-methyl cyclohexanol, 4-methyl cyclohexanol and 3-methyl cyclohexanol. The content of the organic solvent is preferably 1 to 5% by mass relative to the total weight of the developing solution used. The amount of the organic solvent used is related closely to the amount of the surfactant used, and as the amount of the organic solvent is increased, the amount of the anionic surfactant is preferably increased. This is because if the organic solvent is used in a higher amount in the presence of a smaller amount of an anionic surfactant, the organic solvent is not dissolved, thus failing to secure good developing property.

If necessary, additives such as a deforming agent and hard water-softening agent can be contained. The hard water-softening agent includes, for example, polyphosphates such as $Na_2P_2O_7$, $Na_5P_3O_3$, $Na_3P_3O_9$, $Na_2O_4P(NaO_3P)PO_3Na_2$, and Calgon (sodium polymetaphosphate), ethylenediaminetetraacetic acid, potassium salt thereof, sodium salt thereof; diethylenetriaminepentaacetic acid, potassium salt thereof, sodium salt thereof; triethylenetetraminehexaacetic acid, potassium salt thereof, sodium salt thereof; hydroxyethylenediaminetriacetic acid, potassium salt thereof, sodium salt thereof; nitrilotriacetic acid, potassium salt thereof, sodium salt thereof; 1,2-diaminocyclohexanetetraacetic acid, potassium salt thereof, sodium salt thereof; aminopolycarboxylic acids such as 1,3-diamino-2-propanol tetraacetic acid, potassium salt thereof, sodium salt thereof; 2-phosphonobutanetricarboxylic acid-1,2,4, potassium salt thereof, sodium salt thereof; 2-phosphonobutanonetricarboxylic acid-2,3,4, potassium salt thereof, sodium salt thereof; 1-phosphonoethanetricarboxylic acid-1,2,2, potassium salt thereof, sodium salt thereof; organic phosphonic acids such as 1-hydroxyethane-1,1-diphosphonic acid, potassium salt thereof, sodium salt thereof, and aminotri(methylene phosphonic acid), potassium salt thereof, and sodium salt thereof. The optimum amount of the hard water-softening agent is varied depending on the hardness and amount of hard water used, but generally the hard water-softening agent is contained in a range of 0.01 to 5% by mass, and more preferably 0.01 to 0.5% by mass, in the developing solution used.

When the planographic printing plate precursor is developed with an automatic developing machine, the developing solution is exhausted depending on throughput, so throughput capacity may be recovered using a replenishing solution or a fresh developing solution. In this case, the solution is replenished by a method described in U.S. Pat. No. 4,882,246. Developing solutions described in JP-A Nos. 50-26601, 58-54341, JP-B Nos. 56-39464, 56-42860 and 57-7427 are also preferred.

The planographic printing plate precursor which was subjected in this manner to development is post-treated with washing water, a surfactant-containing rinse, and an desensitizing gum solution containing gum arabic and starch derivatives, as described in JP-A Nos. 54-8002, 55-115045 and 59-58431. These treatments can be used in combination as post-treatment of the planographic printing plate precursor of the invention. The planographic printing plate obtained by these treatments is loaded onto an offset printing machine etc. and used for printing on a large number of papers.

In the method of producing the planographic printing plate precursor of the invention, heating or exposing of the whole surface of the image just after development is effective for the purpose of improving image strength and printing press life. Very severe conditions can be utilized in heating after development. Usually, heating is carried out in a range of 200 to 500° C. When the heating temperature after development is low, a sufficient action of reinforcing the image cannot be achieved, while when the temperature is too high, there may arise problems such as deterioration of the substrate and pyrrolysis of the image region.

The planographic printing plate obtained in the treatments described above is loaded onto an offset printing machine etc. and used for printing on a large number of papers.

At the time of printing, a plate cleaner used for removal of smuts on the plate includes PS plate cleaners known in the art, such as CL-1, CL-2, CP, CN-4, CN, CG-1, PC-1, SR and IC (Fuji Photo Film Co., Ltd.).

EXAMPLES

Hereinafter, the present invention is described with reference to the following examples, but the scope of the invention should not be construed to be limited thereto.

Examples 1 to 4, Comparative Example 1

Preparation of a Substrate

<Aluminum Plate>
An aluminum alloy containing 0.06% by mass Si, 0.30% by mass Fe, 0.001% by mass Cu, 0.001% by mass Mn, 0.001% by mass Mg, 0.001% by mass Zn and 0.03% by mass Ti, the balance being Al and inevitable impurities, was used to prepare a melt, then subjected to melting treatment, filtered and formed into an ingot of 500 mm in thickness and 1200 mm in width by a DC casting method. After its surface layer of 10 mm in average thickness was shaved with a surface shaving machine, the ingot was kept at 550° C. for about 5 hours, and when the temperature was reduced to 400° C., the ingot was formed into a rolled plate of 2.7 mm in thickness with a hot rolling mill. Then, the plate was subjected to heat treatment at 500° C. with a continuous annealing device and finished in cold rolling to give a plate of 0.24 mm in thickness as an aluminum plate of JIS 1050 material. This aluminum plate was formed into a plate of 1030 mm in width and then subjected to the following surface treatment.

<Surface Treatment>

In the surface treatment, the following treatments (a) to (j) were successively conducted. After each treatment and water washing, a remaining liquid was removed with nip rollers.

(a) Mechanical Surface Roughening Treatment

Using the device shown in FIG. 3, the surface of the aluminum plate while being supplied with an aqueous suspension of an abrasive having a specific gravity of 1.12 (Pamis) as an abrasive slurry was subjected to mechanical surface roughening treatment with a rotating roller-shaped nylon brush. In FIG. 3, 1 is the aluminum plate, 2 and 4 are roller-shaped brushes, 3 is the abrasive slurry, 5, 6, 7 and 8 are supporting rollers. The average particle diameter of the abrasive was 30 µm, and the maximum particle diameter was 100 µm. The nylon brush was made of 6·10 nylon, the length of the brush hair was 45 mm, and the diameter of the brush hair was 0.3 mm. The nylon brush had hairs arranged densely in holes in a stainless steel cylinder of φ300 mm. Three rotating brushes were used. The distance between the two supporting rollers (φ200 nm) under the brushes was 300 mm. The brush roller was pressed against the aluminum plate until the loading of a driving motor for rotating the brush was increased to 7 kW plus relative to the loading before the brush roller was pressed against the aluminum plate. The direction of rotation of the brush was the same as the direction of movement of the aluminum plate. The number of revolutions of the brush was 200 rpm.

(b) Alkali Etching Treatment

The aluminum plate obtained above was subjected to etching treatment by spraying with an aqueous solution of sodium hydroxide at a concentration of 2.6% by mass and aluminum ion at a concentration of 6.5% by mass at a temperature of 70° C., whereby the aluminum plate was dissolved in an amount of 10 g/m$^2$. Thereafter, the aluminum plate was washed by spraying with water.

(c) De-smut Treatment

The aluminum plate was subjected to de-smut treatment with an aqueous solution (containing 0.5% by mass aluminum ion) of 1% by mass nitric acid at a temperature of 30° C. and then washed by spraying with water. The aqueous solution of nitric acid used in de-smut treatment was waste liquor in the step of electrochemical surface roughening treatment with an alternating current in an aqueous solution of nitric acid.

(d) Electrochemical Surface Roughening Treatment

Figure 4:
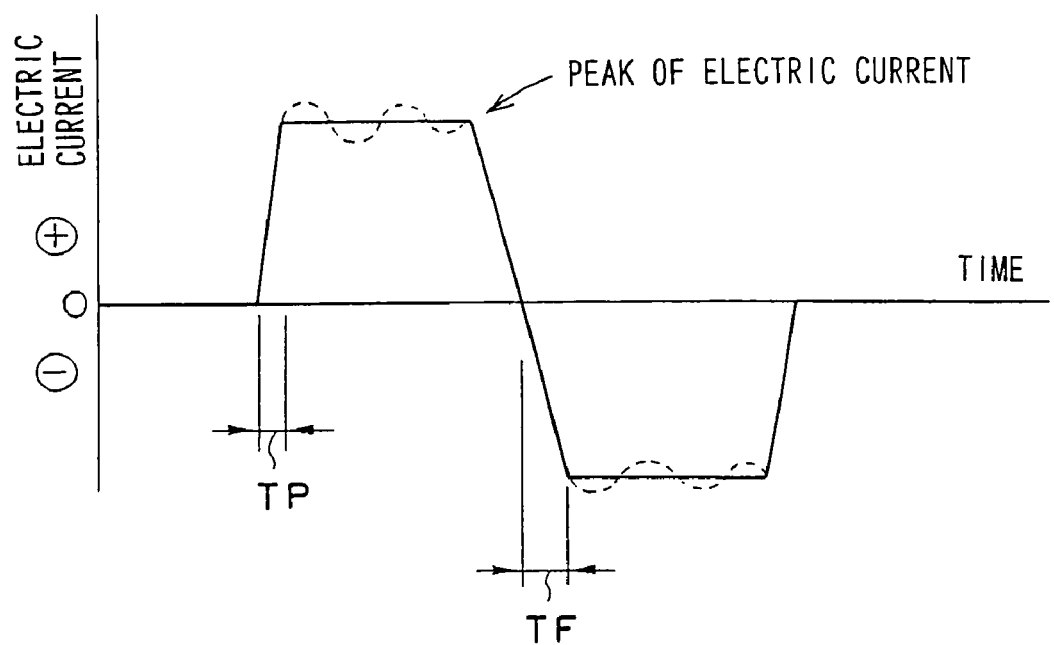
FIG. 4 is a graph showing one example of an alternating waveform electric current waveform used in electrochemical surface roughening treatment in preparation of a substrate of a planographic printing plate of the invention.
Figure 5:
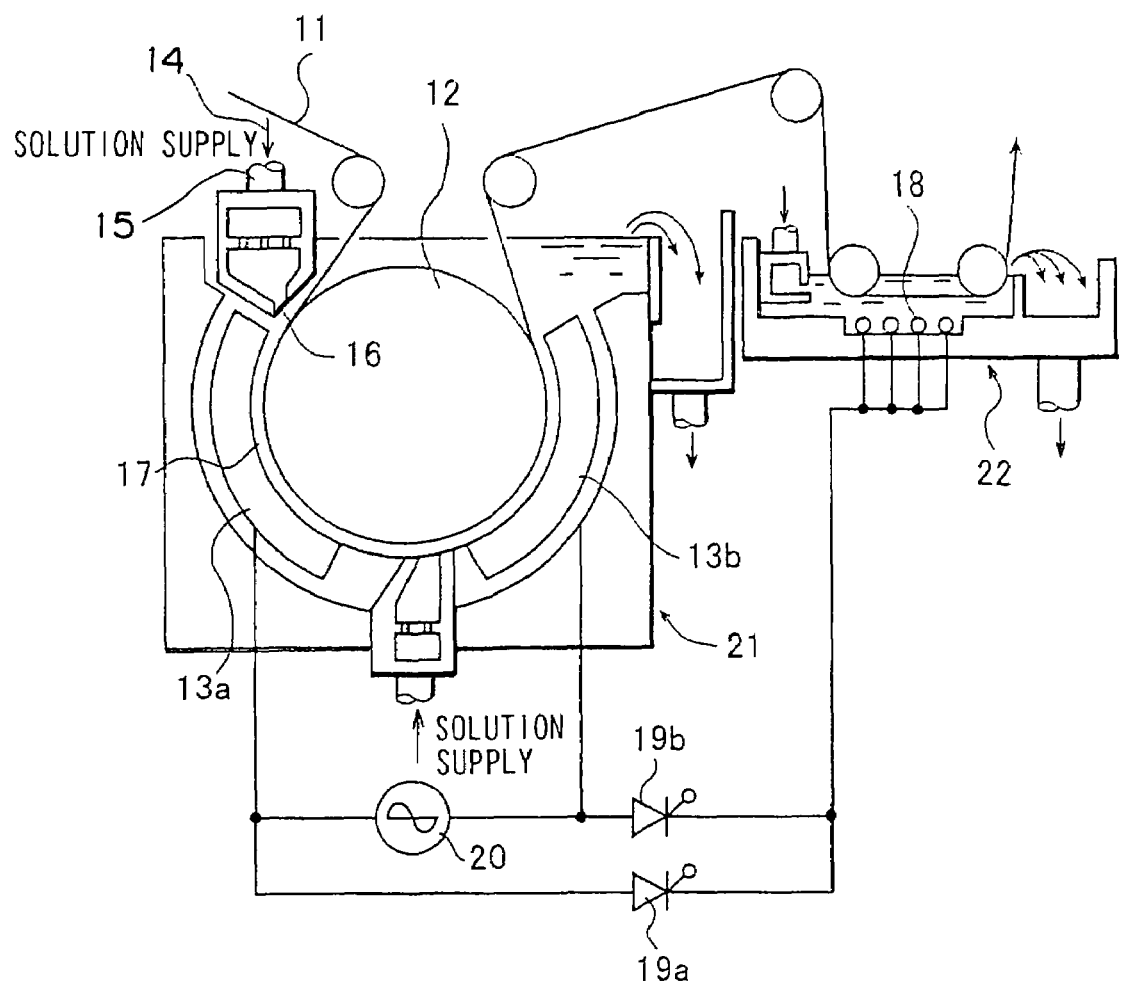
FIG. 5 is a side view showing one example of a radical cell in electrochemical surface roughening treatment using an alternating current in preparation of a substrate of a planographic printing plate of the invention.

The plate was subjected continuously to electrochemical surface roughening treatment with an alternating voltage of 60 Hz. The electrolyte used was 10.5 g/L aqueous nitric acid solution (containing 5 g/L aluminum ion and 0.007% by mass ammonium ion) at a temperature of 50° C. The alternating current power source waveform is shown in FIG. 4, and the electrochemical surface roughening treatment was carried out with a carbon electrode as a counter electrode, wherein the time TP required for the electric current to reach from 0 to the peak was 0.8 msec, the duty ratio was 1:1 and a trapezoid rectangular wave alternating current was used. Ferrite was used as an assistant anode. The electrolytic chamber used is shown in FIG. 5. In FIG. 5, 11 is an aluminum plate, 12 is a radial drum roller, 13a and 13b are major electrodes, 14 is an electrolytic treatment solution, 15 is an electrolyte inlet, 16 is a slit, 17 is an electrolyte passage, 18 is an assistant anode, 19a and 19b are thyristors, 20 is an alternating current source, 21 is a major electrolytic chamber and 22 is an assistant anode chamber.

The current density was 30 A/dm$^2$ in terms of the electric current peak, and the electricity was 220 C/dm$^2$ in terms of the total electricity upon anodizing of the aluminum plate. 5% of the electric current from the power source was fed to the assistant anode. Thereafter, the plate was washed by spraying with water.

(e) Alkali Etching Treatment

The aluminum plate was subjected to etching treatment by spraying with an aqueous solution of sodium hydroxide at a concentration of 26% by mass and aluminum ion at a concentration of 6.5% by mass at a temperature of 32° C., whereby the aluminum plate was dissolved in an amount of 0.50 g/m$^2$, and smut components based on aluminum hydroxide formed by the electrochemical surface roughening treatment using the alternating current in the previous stage were removed, and the edge of the formed pit was dissolved to smooth the edge. Thereafter, washing by spraying with water was carried out.

(f) De-Smut Treatment

The aluminum plate was subjected to de-smut treatment with an aqueous solution (containing 4.5% by mass aluminum ion) of 15% by mass nitric acid at a temperature of 30° C. and then washed by spraying with water. The aqueous solution of nitric acid used in de-smut treatment was waste liquor in the step of electrochemical surface roughening treatment with an alternating current in an aqueous solution of nitric acid.

(g) Electrochemical Surface Roughening Treatment

The plate was subjected continuously to electrochemical surface roughening treatment with an alternating voltage of 60 Hz. The electrolyte used was 5.0 g/L aqueous hydrochloric acid solution (containing 5 g/L aluminum ion) at a temperature of 35° C. The alternating current power source waveform is shown in FIG. 4, and the electrochemical surface roughening treatment was carried out with a carbon electrode as a counter electrode, wherein the time TP required for the electric current to reach from 0 to the peak was 0.8 msec, the duty ratio was 1:1 and a trapezoid rectangular wave alternating current was used. Ferrite was used as an assistant anode. The electrolytic chamber used is shown in FIG. 5.

The current density was 25 A/dm$^2$ in terms of the electric current peak, and the electricity was 50 C/dm$^2$ in terms of the total electricity upon anodizing of the aluminum plate. Thereafter, the plate was washed by spraying with water.

(h) Alkali Etching Treatment

The aluminum plate was subjected to etching treatment by spraying with an aqueous solution of sodium hydroxide at a concentration of 26% by mass and aluminum ion at a concentration of 6.5% by mass at a temperature of 32° C., whereby the aluminum plate was dissolved in an amount of 0.10 g/m$^2$, and smut components based on aluminum hydroxide formed by the electrochemical surface roughening treatment using the alternating current in the previous stage were removed, and the edge of the formed pit was dissolved to smooth the edge. Thereafter, washing by spraying with water was carried out.

(i) De-smut Treatment

The aluminum plate was subjected to de-smut treatment by spraying with an aqueous solution (containing 0.5% by mass aluminum ion) of 25% by mass sulfuric acid at a temperature of 60° C. and then washed by spraying with water.

(j) Anodizing Treatment

Anodizing treatment was carried out with an anodizing device having the structure shown in FIG. 6 to give a substrate for planographic printing. In FIG. 6, 410 is an anodizing treatment device, 412 is an electrical supply chamber, 414 is an electrolytic treatment chamber, 416 is an aluminum plate, 418 and 426 are electrolytes, 420 is an electrical supply electrode, 422 and 428 are rollers, 424 is a nip roller, 430 is an electrolysis electrode, 432 is a chamber wall and 434 is an direct current source. The electrolytes used to be supplied to the first and second electrolytic zones were sulfuric acid. Both the electrolytes were 170 g/L sulfuric acid (containing 0.5% by mass aluminum ion) at a temperature of 38° C. Thereafter, washing by spraying with water was carried out. The final anodized coating was 2.7 g/m².

[Undercoat]

Then, an undercoat solution shown below was applied using a wire bar onto the aluminum substrate and dried at 90° C. for 30 seconds in a hot-air drying oven. The amount of the coating after drying was 10 mg/m².

| <Undercoat solution> | |
| --- | --- |
| Ethyl acrylate/sodium 2-acrylamide-2-methyl-1-propanesulfonate (molar ratio 75:15) | 0.1 g |
| 2-Aminoethylphosphonic acid | 0.1 g |
| Methanol | 50 g |
| Ion-exchange water | 50 g |

[Photosensitive Layer]

Then, the photosensitive layer coating solution [P-1] below was prepared and applied by using a wire bar onto the aluminum substrate which had been coated with the undercoat described above. The solution was dried at 80° C. for 43.5 seconds in a hot-air drying oven to form a photosensitive layer. The amount of the coating after drying was 1.4 g/m².

| <Photosensitive layer coating solution [P-1]> | |
| --- | --- |
| IR absorber (IR-1) | 0.08 g |
| Polymerization initiator (OS-8) | 0.25 g |
| Dipentaerythritol hexaacrylate | 1.00 g |
| Binder (BT-1) | 1.00 g |
| Ethyl Violet chloride | 0.04 g |
| Fluorine-type surfactant (trade name: MEGAFACE F-780-F manufactured by Dainippon Ink and Chemicals, Inc.) | 0.03 g |
| Carboxylic acid compound (C-1) | 0.11 g |
| Methyl ethyl ketone | 10.4 g |
| Methanol | 4.83 g |
| 1-Methoxy-2-propanol | 10.4 g |

[Protective Layer]

An aqueous solution mixture of polyvinyl alcohol (the degree of saponification of 98 mole-%, the degree of polymerization of 500), polyvinyl pyrrolidone (Rubiscol K-30 manufactured by BASF Japan Ltd.) and an UV absorber shown in Table 1 was applied by using a wire bar onto the surface of the photosensitive layer and dried at 125° C. for 75 seconds in a hot-air drying oven to form a protective layer, whereby the planographic printing plate precursor in each of Examples 1 to 4 and Comparative Example 1 was obtained. The content of PVA and the coating amount (coating amount after drying) was 1.5 g/m². The type and amount of the UV absorber used are shown in Table 1. The coefficient of dynamic friction of the surface of the protective layer was 0.45.

Examples 5 to 8, Comparative Example 2

The photosensitive layer coating solution [P-2] below was prepared and applied by using a wire bar onto the substrate previously coated with an undercoat in Example 1. The solution was dried at 80° C. for 43.5 seconds in a hot-air drying oven to form a photosensitive layer. The amount of the coating after drying was 1.4 g/m². The protective layer was formed in the same manner as in Example 1 on the photosensitive layer to give the planographic printing plate precursor in each of Examples 4 to 8 and Comparative Examples 2 and 3. The type and amount of the UV absorber used in the protective layer are shown in Table 1. The coefficient of dynamic friction of the surface of the protective layer was 0.45.

| <Photosensitive layer coating solution [P-2]> | |
| --- | --- |
| IR absorber (IR-1) | 0.08 g |
| Polymerization initiator (OS-8) | 0.25 g |
| Polymerizable compound (M-1) | 0.5 g |
| Polymerizable compound (M-2) | 0.5 g |
| Binder (BT-2) | 1.00 g |
| Ethyl Violet chloride | 0.04 g |
| Fluorine-type surfactant (trade name: MEGAFACE F-780-F manufactured by Dainippon Ink and Chemicals, Inc.) | 0.03 g |
| Carboxylic acid compound (C-1) | 0.11 g |
| Methyl ethyl ketone | 10.4 g |
| Methanol | 4.83 g |
| 1-Methoxy-2-propanol | 10.4 g |

The structures of the IR absorber (IR-1), the polymerization initiator (OS-8), the polymerizable compounds (M-1) and (M-2), the binders (BT-1) and (BT-2) and the carboxylic acid compound (C-1) used in the photosensitive layer coating solutions [P-1] and [P-2] are shown below.

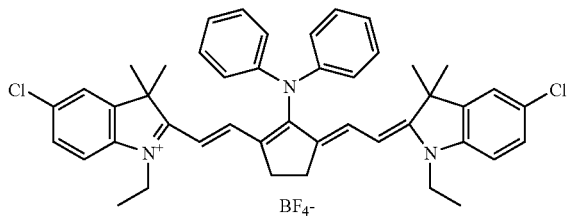

(IR-1)

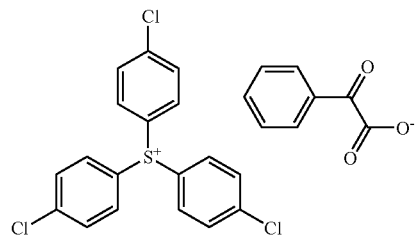

(OS-8)

-continued

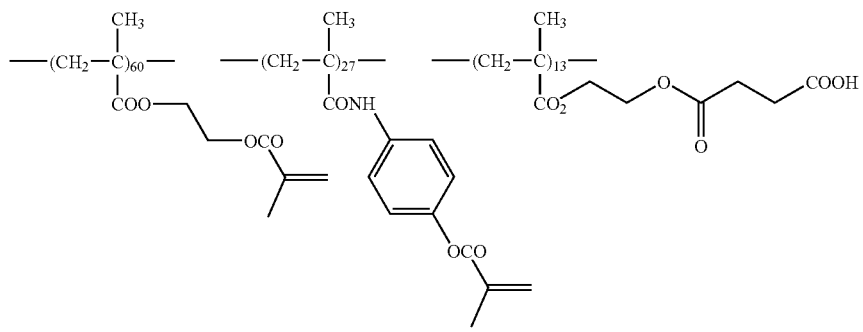
(BT-1)

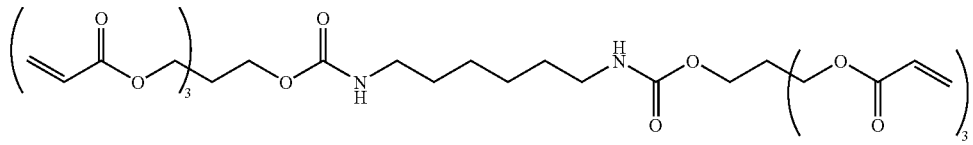
(M-1)

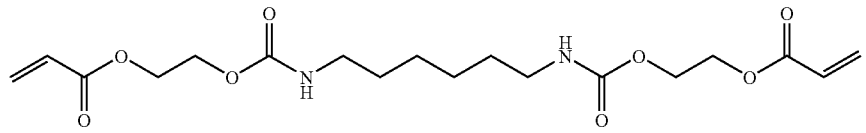
(M-2)

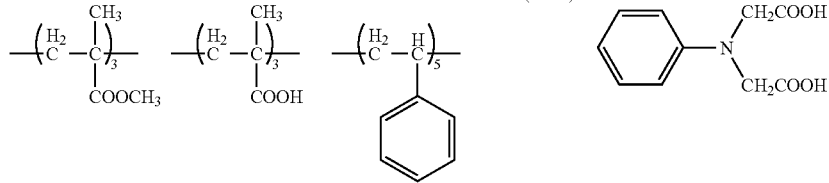
(BT-2)   (C-1)

[Plate-making Process]

<Exposure Step>

The resultant negative-type planographic printing plate precursor was exposed to light with a laser output power in a range of 0 to 8 W changed by 0.15 in log E with a resolution of 175 lpi at an outer drum revolution number of 150 rpm by Trendsetter-3244VX (trade name, manufactured by CREO Co., Ltd.) equipped with a water-cooling 40-W infrared semiconductor laser.

<Development Step>

After the exposure, the image was developed in an automatic developing machine IP85HD manufactured by G&J, at a line speed of 1.35 m/min. at a pre-heat temperature shown in Table 1 at a development temperature of 25° C. A dilution of DV-2 (Fuji Photo Film Co., Ltd.) with water in a ratio of 1:4 was used as the developing solution, and a dilution of FP-2W (Fuji Photo Film Co., Ltd.) with water in a ratio of 1:1 was used as the finisher.

[Evaluation of the Planographic Printing Plate]

(1) Sensitivity Evaluation

The planographic printing plate was evaluated under 50% RH at 25° C. at the time of exposure. The resulting image density of the planographic printing plate was measured with a Macbeth reflection densitomer RD-918, and a red filter attached to the densitomer was used to measure the cyan density. A reciprocal number of the amount of exposure light necessary for attaining a density of 0.8 was evaluated as sensitivity. The results are shown in relative sensitivity assuming that the sensitivity in Example 1 was regarded as 100. A higher value indicates higher sensitivity.

(2) Evaluation of Safelight Safety

An unexposed sample was exposed to 400 Lux light from a white fluorescent lamp (FLR40SW manufactured by Mitsubishi Electric Corporation) under an environment of 50% RH and 25° C. An exposure time at which a residual film occurred in development was measured. The criteria was whether a residual film occurred in development after the exposure to light for 45 minutes.

(3) Printing Evaluation

80% screen tint image with a resolution of 175 lpi was exposed to light with an output power of 8 W at an outer drum revolution number of 206 rpm with an energy of 100 mJ/cm$^2$ on the printing matrix by Trendsetter-3244VX (trade name, manufactured by CREO Co., Ltd.) equipped with a water-cooling 40-W infrared semiconductor laser. The planographic printing plate obtained by development was used in printing with a printing machine Lithron manufactured by Komori Corporation, to evaluate printing press life.

The results are shown in Table 1.

TABLE 1

| | UV absorber | | Preheat temperature (° C.) | Sensitivity | Safelight safety (minute) | Printing press life (number of prints) |
|---|---|---|---|---|---|---|
| | Compound No. | Coating amount [mg/m²] | | | | |
| Comparative Example 1 | — | — | 120 | 100 | 5 | 100,000 |
| Example 1 | 1-2 | 50 | 120 | 100 | 45 or more | 100,000 |
| Example 2 | 1-5 | 50 | 120 | 100 | 45 or more | 100,000 |
| Example 3 | 1-20 | 40 | 120 | 100 | 45 or more | 100,000 |
| Example 4 | 1-26 | 60 | 120 | 100 | 45 or more | 100,000 |
| Comparative Example 2 | — | — | Room temperature | 110 | 5 | 100,000 |
| Comparative Example 3 | — | — | 120 | 110 | 5 | 100,000 |
| Example 5 | 1-2 | 50 | Room temperature | 110 | 45 or more | 100,000 |
| Example 6 | 1-2 | 50 | 120 | 110 | 45 or more | 100,000 |
| Example 7 | 1-11 | 50 | Room temperature | 110 | 45 or more | 100,000 |
| Example 8 | 1-18 | 50 | Room temperature | 110 | 45 or more | 100,000 |

As is evident from Table 1, it was found that the planographic printing plate precursors of the invention in Examples 1 to 8 are excellent in sensitivity and safelight safety and superior in printing press life for dot prints. On the other hand, it was found that the planographic printing plate precursors not containing an UV absorber in the protective layer in Comparative Examples 1 to 3 are inferior in safelight safety, are difficult to handle under white light and are problematic in terms of practicality.

The planographic printing plate precursor of the invention is advantageous in that it is capable of highly sensitive writing with an infrared laser, is excellent in safelight safety, can be handled under white light and is excellent in printing press life particularly in halftone dot regions.

What is claimed is:

1. A planographic printing plate precursor, comprising:

a substrate;

a photosensitive layer comprising an IR absorber, a polymerization initiator, a polymerizable compound and a binder polymer; and a protective layer containing a UV absorber, disposed in this order, wherein the photosensitive layer exhibits reduction in solubility in an alkaline developing solution upon being exposed to light having a wavelength of 750 nm to 1400 nm;

the photosensitive layer further comprises a compound containing at least one carboxylic group and having a weight-average molecular weight of 3000 or less;

the compound containing at least one carboxylic group is one selected from the group consisting of a phthalic acid derivative, a trimellitic acid derivative, a pyromellitic acid derivative, a succinic acid derivative, a benzoic acid derivative and a glycine derivative; and the UV absorber is represented by the following Formula [1-a], [1-s], [1-c] or [1-d]:

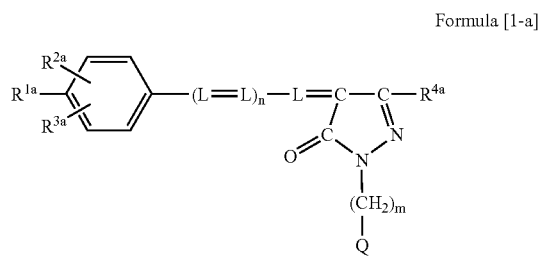

Formula [1-a]

wherein in Formula [1-a], $R^{1a}$ is an atomic group represented by —OX or —N(X)(Y), wherein X and Y each represent a hydrogen atom, alkyl group, cyanoalkyl group, carboxyalkyl group, sulfoalkyl group, hydroxylalkyl group, halogenated alkyl group or optionally substituted alkyl group, or a sodium or potassium salt thereof; $R^{2a}$ and $R^{3a}$ each represent a hydrogen atom, halogen atom, alkyl group, hydroxyl group, alkoxy group, alkylthio group, or the same group as the above-mentioned —OX group; Q represents a phenyl group, sulfoalkyl group, sulfoalkoxyalkyl group or sulfoalkylthioalkyl group, each of which is substituted with at least one halogen atom, carboxy group, sulfo group, sulfoalkyl group, or sodium or potassium salt thereof; L represents an optionally substituted methine group; $R^{4a}$ represents an alkyl group, carboxy group, alkyloxycarbonyl group, or acyl-substituted or unsubstituted amino group; m is 1 or 2; and n is 0 or 1;

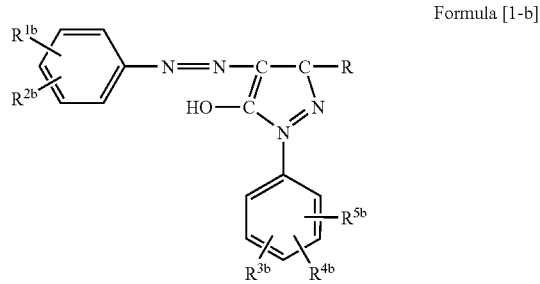

Formula [1-b]

in formula [1-b], $R^{1b}$, $R^{2b}$, $R^{3b}$, $R^{4b}$ and $R^{5b}$ each represent a hydrogen atom, halogen atom, alkyl group, hydroxyl group, alkoxy group, amino group, acylamino group, carboxyl group or sulfone group, or a sodium or potassium salt thereof; and R represents an alkyl group or carboxyl group;

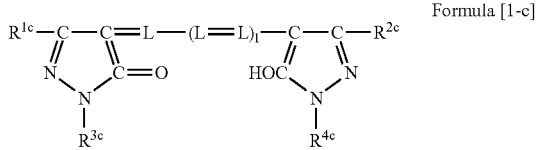

Formula [1-c]

in formula [1-c], $R^{1c}$ and $R^{2c}$ each represent an alkyl group, substituted alkyl group, aryl group, alkoxycarbonyl group or carboxyl group; $R^{3c}$ and $R^{4c}$ each represent a sulfonic acid group, an alkyl or sulfonic acid group substituted with a carboxyl group, an aryl group substituted with a carboxyl group or sulfonic acid group, or a sodium or potassium salt thereof; L represents a substituted or unsubstituted methine chain; M represents sodium, potassium or a hydrogen atom; and 1 is 0 or 1;

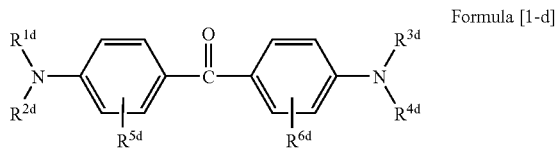

Formula [1-d]

in formula [1-d], $R^{1d}$, $R^{2d}$, $R^{3d}$ and $R^{4d}$ each represent an alkyl group, hydroxyalkyl group, cyano group, alkylcyano group, alkoxy group or sulfoalkyl group; and $R^{5d}$ and $R^{6d}$ each represent a sulfonic acid group and alkylsulfonic acid group.

2. The planographic printing plate precursor of claim 1, wherein the UV absorber has a maximum absorption at a wavelength in a range of 300 to 420 nm.

3. The planographic printing plate precursor of claim 1, wherein a developing rate of an unexposed portion of the photosensitive layer by an alkaline developing solution having a pH of 10 to 13.5 is 80 nm/sec or more, and a permeation rate of the alkaline developing solution to an exposed portion of the photosensitive layer is 100 nF/sec or less.

4. The planographic printing plate precursor of claim 1, wherein the IR absorber is one selected from the group consisting of a cyanine dye, a squarylium dye, a pyrylium salt, a nickel/thiolate complex and an indolenine cyanine dye.

5. The planographic printing plate precursor of claim 1, wherein the IR absorber is a pigment having a particle diameter of 0.01 to 10 µm.

6. The planographic printing plate precursor of claim 1, wherein an absorbance of the photosensitive layer at a maximum absorption wavelength in a range of 760 to 1200 nm is 0.5 to 1.2 measured by a reflection measurement method.

7. The planographic printing plate precursor of claim 1, wherein the polymerization initiator is a radical-generating agent which is decomposed by heat to generate radicals.

8. The planographic printing plate precursor of claim 7, wherein the radical-generating agent is an onium salt.

9. The planographic printing plate precursor of claim 1, wherein the polymerization initiator is contained in the photosensitive layer in an amount of 0.1 to 50% by mass based on a total solid content of the photosensitive layer.

10. The planographic printing plate precursor of claim 1, wherein an acid value (meq/g) of the binder polymer is in a range of 2.00 to 3.60.

11. The planographic printing plate precursor of claim 1, wherein the binder polymer has a radical-polymerizable group.

12. The planographic printing plate precursor of claim 1, wherein the binder polymer has an alkali-soluble group.

13. The planographic printing plate precursor of claim 1, wherein the binder polymer has a weight-average molecular weight of 2,000 to 1,000,000.

14. The planographic printing plate precursor of claim 1, wherein the binder polymer has a glass transition point (Tg) of 70 to 300° C.

15. The planographic printing plate precursor of claim 1, wherein the binder polymer comprises a repeating unit represented by the following formula (I):

Formula (I)

wherein $R^1$ represents a hydrogen atom or a methyl group; $R^2$ represents a linking group composed of atoms selected from carbon atoms, hydrogen atoms, oxygen atoms, nitrogen atoms, sulfur atoms and halogen atoms, wherein a number of atoms excluding atoms in a substituent group is 2 to 30; A represents an oxygen atom or —$NR^3$— wherein $R^3$ represents a hydrogen atom or a monovalent hydrocarbon group having 1 to 10 carbon atoms; and n is an integer from 1 to 5.

16. The planographic printing plate precursor of claim 1, further comprising an intermediate layer between the photosensitive layer and the substrate.

17. The planographic printing plate precursor of claim 1, wherein the compound containing at least one carboxylic group is one selected from the group consisting of a phthalic acid derivative, a trimellitic acid derivative, a pyromellitic acid derivative, and a succinic acid derivative.

* * * * *